United States Patent
Nakatani

(10) Patent No.: US 9,136,580 B2
(45) Date of Patent: Sep. 15, 2015

(54) QUADRATURE HYBRID COUPLER, AMPLIFIER, AND WIRELESS COMMUNICATION DEVICE

(71) Applicant: PANASONIC CORPORATION, Osaka (JP)

(72) Inventor: Toshifumi Nakatani, Kanagawa (JP)

(73) Assignee: Panasonic Corporation, Osaka (JP)

( * ) Notice: Subject to any disclaimer, the term of this patent is extended or adjusted under 35 U.S.C. 154(b) by 85 days.

(21) Appl. No.: 14/130,875

(22) PCT Filed: Nov. 16, 2012

(86) PCT No.: PCT/JP2012/007386
§ 371 (c)(1),
(2) Date: Jan. 3, 2014

(87) PCT Pub. No.: WO2013/102964
PCT Pub. Date: Jul. 11, 2013

(65) Prior Publication Data
US 2014/0154981 A1    Jun. 5, 2014

(30) Foreign Application Priority Data
Jan. 5, 2012    (JP) .................................. 2012-000793

(51) Int. Cl.
*H04B 1/18* (2006.01)
*H01P 5/20* (2006.01)
(Continued)

(52) U.S. Cl.
CPC .............. *H01P 5/20* (2013.01); *H01L 23/5223* (2013.01); *H01L 23/5227* (2013.01); *H01P 5/227* (2013.01); *H03F 1/0288* (2013.01); *H03F 3/195* (2013.01); *H03F 3/245* (2013.01);
(Continued)

(58) Field of Classification Search
CPC ................................ H04B 1/0458; H04B 1/18
USPC ............................................................ 455/80
See application file for complete search history.

(56) References Cited

U.S. PATENT DOCUMENTS 5,359,304 A * 10/1994 Fujiki ........................... 333/116
5,978,206 A    11/1999 Nishimura et al.
(Continued)

FOREIGN PATENT DOCUMENTS

JP    06-284043 A    10/1994
JP    08-279705 A    10/1996
(Continued)

OTHER PUBLICATIONS

Elmala et al, "A 90-nm CMOS Doherty Power Amplifier with Minimum AM-PM Distortion," IEEE Journal of Solid-State Circuits 41(6), 1323-1332, 2006.
(Continued)

*Primary Examiner* — Wen Huang
(74) *Attorney, Agent, or Firm* — Seed IP Law Group PLLC

(57) ABSTRACT

A shunt capacitor includes first and second zigzag wirings having different lengths, formed in a first wiring layer, third and second zigzag wirings having different lengths, formed in a second wiring layer, an induction device and a ground. The first and fourth zigzag wirings are connected to the induction device, and the second and third zigzag wirings are connected to the ground. The first and second zigzag wirings and the third and fourth zigzag wirings cross each other three-dimensionally.

18 Claims, 20 Drawing Sheets

(51) Int. Cl.
  *H03F 3/195* (2006.01)
  *H03F 3/24* (2006.01)
  *H01L 23/522* (2006.01)
  *H03F 99/00* (2009.01)
  *H04B 5/00* (2006.01)
  *H03F 1/02* (2006.01)
  *H01P 5/22* (2006.01)
  *H03H 7/48* (2006.01)
  *H01L 27/08* (2006.01)

(52) U.S. Cl.
  CPC ............ *H03F 21/00* (2013.01); *H04B 5/0075* (2013.01); *H01L 27/08* (2013.01); *H01L 2924/0002* (2013.01); *H03F 2200/192* (2013.01); *H03F 2200/198* (2013.01); *H03F 2200/336* (2013.01); *H03F 2200/408* (2013.01); *H03F 2200/411* (2013.01); *H03H 7/48* (2013.01)

(56) References Cited

U.S. PATENT DOCUMENTS

| | | | |
|---|---|---|---|
| 6,806,789 B2 | 10/2004 | Bawell et al. | |
| 6,822,312 B2 | 11/2004 | Sowlati et al. | |
| 6,864,526 B2 | 3/2005 | Inbe | |
| 7,459,989 B2 | 12/2008 | Ezzeddine et al. | |
| 7,548,737 B2 | 6/2009 | Domino et al. | |
| 2002/0057136 A1* | 5/2002 | Marketkar et al. | 333/24 R |
| 2003/0020562 A1* | 1/2003 | Ikada et al. | 333/133 |
| 2003/0137363 A1 | 7/2003 | Bawell et al. | |
| 2008/0083967 A1 | 4/2008 | Nakatani et al. | |
| 2012/0092090 A1* | 4/2012 | Ahn et al. | 333/204 |
| 2012/0099813 A1* | 4/2012 | Lee et al. | 385/3 |

FOREIGN PATENT DOCUMENTS

| | | |
|---|---|---|
| JP | 11-168182 A | 6/1999 |
| JP | 2003-530699 A | 10/2003 |
| JP | 2004-95754 A | 3/2004 |
| JP | 2005-516452 A | 6/2005 |
| JP | 2008-112974 A | 5/2008 |
| JP | 2009-027410 A | 2/2009 |
| JP | 2009-239882 A | 10/2009 |
| JP | 2010-021719 A | 1/2010 |
| JP | 2011-254496 A | 12/2011 |

OTHER PUBLICATIONS

International Search Report, mailed Feb. 19, 2013, for PCT/JP2012/007386, 4 pages.

Frye et al , "A 2-GHz Quadrature Hybrid Implemented in CMOS Technology," IEEE Journal of Solid-State Circuits 38:3, pp. 550-555, Mar. 2003.

* cited by examiner (a)

(b)

(a)

(b)

(c)

(a)

(b)

(a)

(b)　　　　　　　　　(c)

(a)

(b)

(c)

(a)

(b)

(c)

(a)

(b)

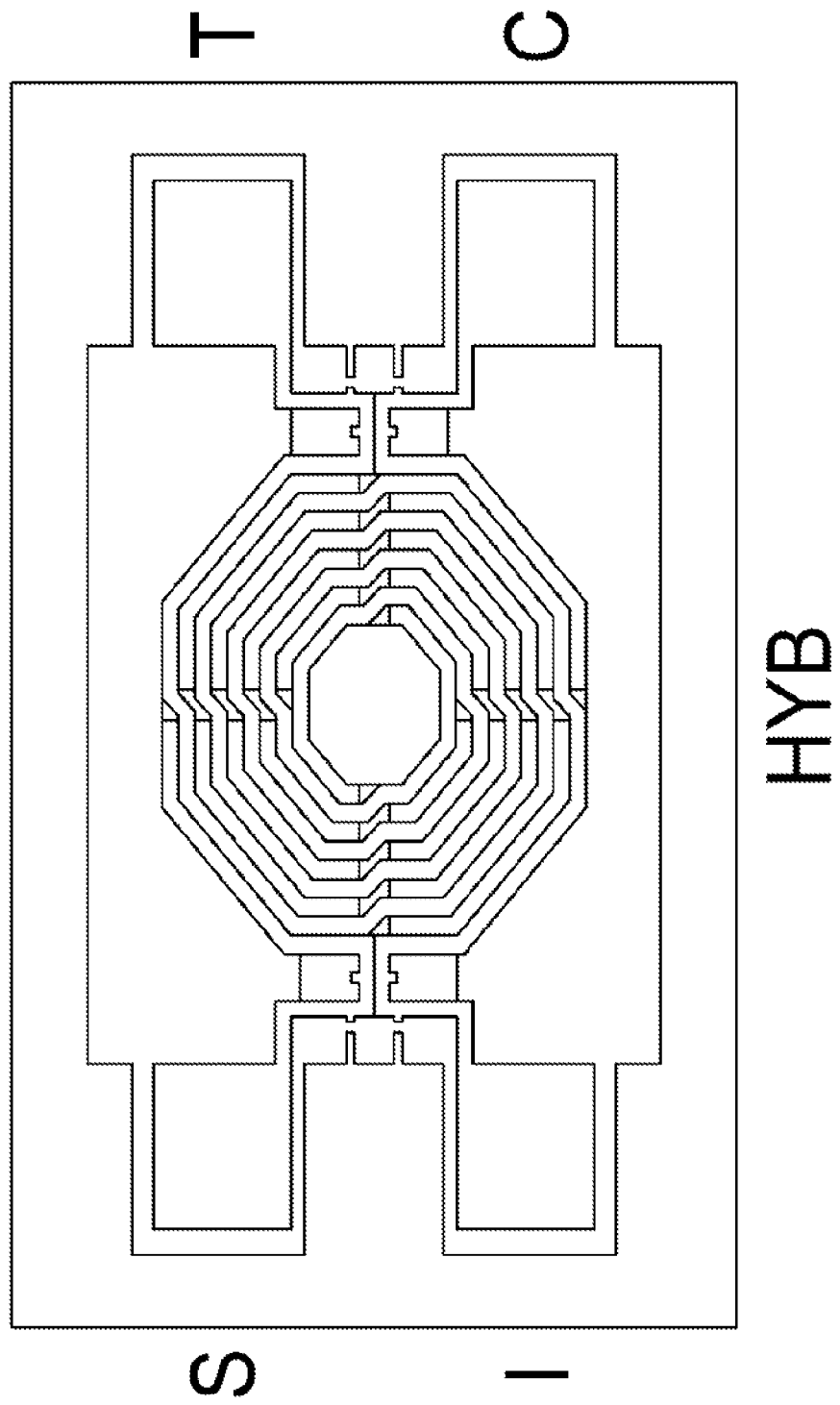

QUADRATURE HYBRID COUPLER, AMPLIFIER, AND WIRELESS COMMUNICATION DEVICE

TECHNICAL FIELD

The present disclosure relates to a quadrature hybrid coupler, an amplifier and a wireless communication device used for a wireless communication.

BACKGROUND ART

In recent years, in a mobile terminal (for example, a smart phone) that allows a wireless communication, the demand for transmission and reception of a large amount of content is increased. For example, wireless communication in a millimeter wave band having a transmission rate of 1 Gbps or greater, particularly, in a 60 GHz band has attracted attention. As the semiconductor technology has advanced in recent years, it is expected that the wireless communication using the millimeter wave band becomes possible.

A quadrature hybrid coupler is used as one of circuit components used in the wireless communication in the millimeter wave band. The quadrature hybrid coupler is a circuit component of one input and two outputs, for example, and ideally, two output signals have the same amplitude and a phase difference of 90 degrees therebetween. In the wireless communication in the millimeter wave band, the quadrature hybrid coupler is built in an integrated circuit (IC) of a wireless communication terminal.

FIG. 19 is a diagram illustrating a quadrature hybrid coupler disclosed in Patent Literature 1. FIG. 19(a) is an equivalent circuit diagram, and FIG. 19(b) is a layout diagram. The quadrature hybrid coupler in Patent Literature 1 is a quadrature hybrid coupler of a modified capacitive coupling type. Parasitic capacitance between spiral inductors L3 and L4 is used for the coupling capacitor.

FIG. 20 is a layout diagram of a quadrature hybrid coupler disclosed in Non-Patent Literature 1. In FIG. 20, a quadrature hybrid coupler of a magnetic coupling type is shown, in which a transformer is disposed at the center thereof, and a coupling capacitor and a shunt capacitor are disposed on opposite sides thereof.

An equivalent circuit diagram and a layout example of a hybrid coupler are disclosed in Patent Literature 2. The hybrid coupler disclosed in Patent Literature 2 is a quadrature hybrid coupler of a wavelength-reduced magnetic coupling type. Parasitic capacitance between transformers is used as a coupling capacitor and a shunt capacitor.

Patent Literature 3, Patent Literature 4 and Patent Literature 5 disclose circuits of the similar hybrid coupler. The circuits will be appropriately referenced in description of embodiments of the present disclosure, and description thereof will be omitted herein.

CITATION LIST

Patent Literature

Patent Literature 1: U.S. Pat. No. 7,459,989
Patent Literature 2: U.S. Pat. No. 6,806,789
Patent Literature 3: JP-T-2003-530699
Patent Literature 4: JP-A-2008-112974
Patent Literature 5: JP-A-11-168182

Non Patent Literature

Non-Patent Literature 1: R. C. Frye, et al., "A 2 GHz Quadrature Hybrid Implemented in CMOS Technology." IEEE JSSC, vol. 38, no. 3, pp. 550-555, March 2003

SUMMARY OF INVENTION

Technical Problem

However, in the quadrature hybrid couplers disclosed in Patent Literature 1 and Patent Literature 2, it is difficult to independently design values of the inductors or the transformers and the capacitors.

Further, when a MOM capacitor in the related art is used as the shunt capacitor of the quadrature hybrid coupler disclosed in Non-Patent Literature 1, a wiring that connects the transformer, the capacitor and the ground becomes long.

To solve the above problems, there are provided a quadrature hybrid coupler, an amplifier and a wireless communication device that reduce the length of each connection wiring from a shunt capacitor inserted between an induction device and a ground to the induction device or the ground and reduce an amplitude error and a phase error of an output signal with respect to an input signal.

Solution to Problem

According to an aspect of the present disclosure, there is provided a quadrature hybrid coupler including: an induction device that includes a first terminal, a second terminal, a third terminal and a fourth terminal; a first microstrip transmission line, a second microstrip transmission line and a third microstrip transmission line that are connected to the first, second and third terminals; a first coupling capacitor and a second coupling capacitor that are respectively arranged between the first terminal and the second terminal and between the third terminal and the fourth terminal; a first shunt capacitor, a second shunt capacitor, a third shunt capacitor and a fourth shunt capacitor that are inserted between the first, second, third and fourth terminals and a ground of the first, second and third microstrip transmission lines; and a termination resistance that is inserted between the fourth terminal and the ground of the first, second and third microstrip transmission lines, wherein each of the first, second, third and fourth shunt capacitors includes N wiring layers including, where N is an integer of 2 or greater, a K-th layer wiring provided in at least a K-th wiring layer, where K is any one of 1 to N−1, and a (K+1)-th layer wiring provided in a (K+1)-th wiring layer, the K-th layer wiring including a first zigzag wiring connected to the induction device, and a second zigzag wiring that is connected to the ground of the microstrip transmission lines, and has a length different from a length of the first zigzag wiring, and the (K+1)-th layer wiring including a third zigzag wiring connected to the induction device, and a fourth zigzag wiring that is connected to the ground of the microstrip transmission lines, and has a length different from a length of the third zigzag wiring, wherein each of the first, second third and fourth zigzag wirings has a zigzag pattern in which a wiring along a first direction and a wiring along a second wiring crossing the first direction are coupled to each other and the wiring along the first direction and the wiring along the second direction are alternately repeated.

Advantageous Effects of Invention

According to the present disclosure, it is possible to reduce the length of each connection wiring from a shunt capacitor inserted between an induction device and a ground to the induction device or the ground, and to reduce an amplitude error and a phase error of an output signal with respect to an input signal.

BRIEF DESCRIPTION OF DRAWINGS

FIG. 11(c) is a diagram illustrating a positional relationship between floating wirings provided in a second layer provided one-higher over the lowest layer and vias.

FIG. 20 is a layout diagram of a quadrature hybrid coupler disclosed in Non-Patent Literature 1.

DESCRIPTION OF EMBODIMENTS (Background of Content of Respective Embodiments)

A quadrature hybrid coupler includes a type using a distributed constant circuit and a type using a lumped constant circuit type. In a millimeter wave band, in order to realize a small and low-loss quadrature hybrid coupler, for example, it is preferable to use an LC lumped constant circuit.

Figure 18:
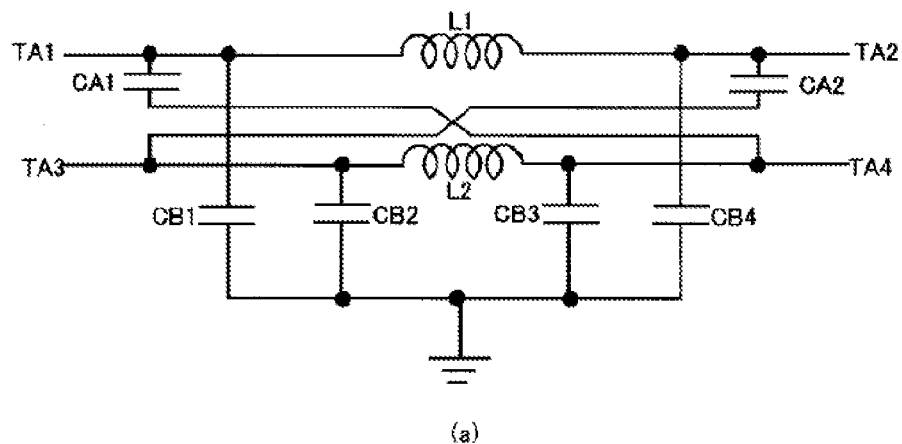
FIG. 18 is a circuit diagram of a quadrature hybrid coupler using an LC lumped constant circuit, in which (a) illustrates a capacitive quadrature hybrid coupler, (b) illustrates a magnetic quadrature hybrid coupler, and (c) illustrates a wavelength-reduced magnetic quadrature hybrid coupler.
Figure 18:
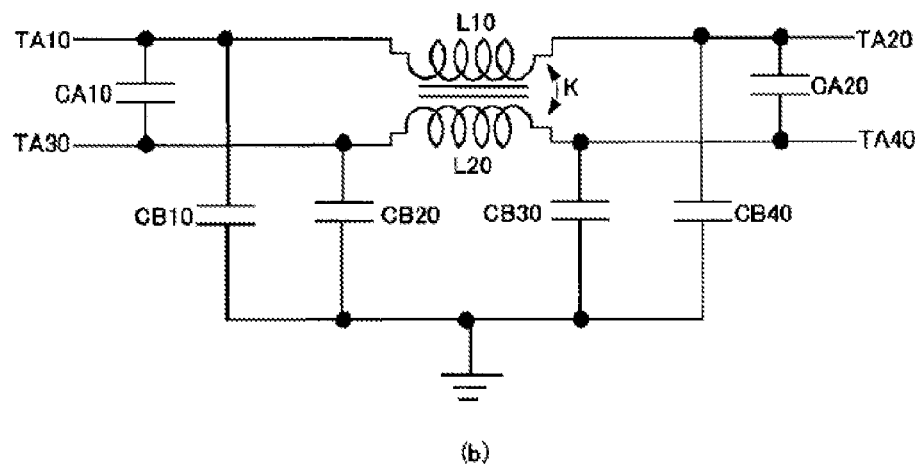
Figure 18:
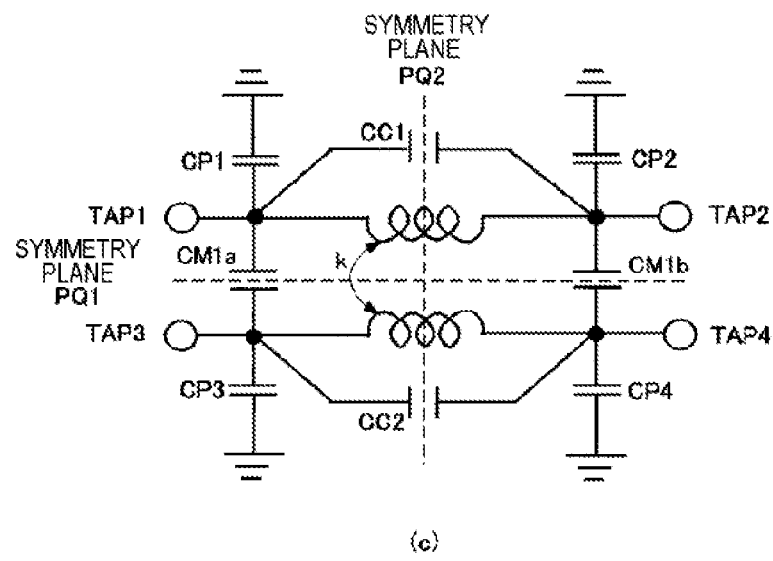
Figure 19:
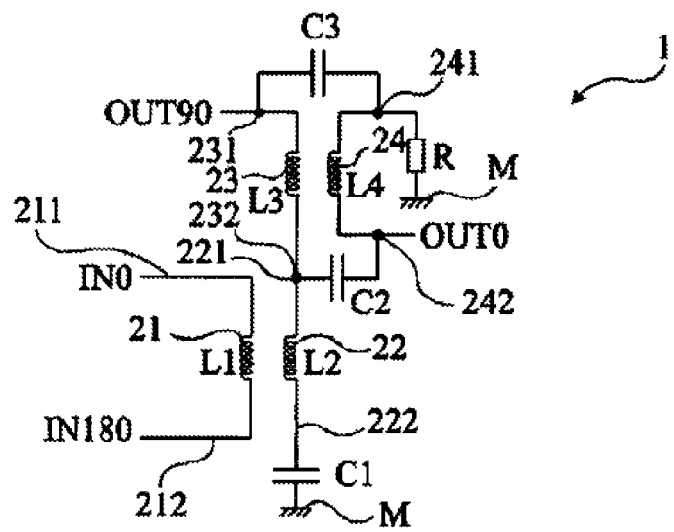
FIG. 19 is a diagram illustrating a quadrature hybrid coupler disclosed in Patent Literature 1, in which (a) is an equivalent circuit diagram and (b) is a layout diagram.
Figure 19:
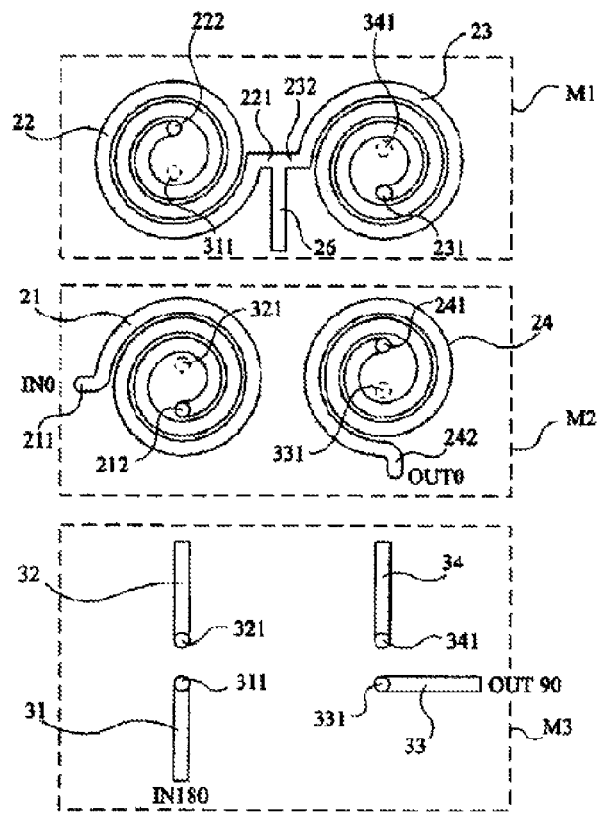

FIG. 18 is a circuit diagram of a quadrature hybrid coupler using the LC lumped constant circuit. FIG. 18(a) shows a quadrature hybrid coupler of a capacitive coupling type. FIG. 18(b) shows a quadrature hybrid coupler of a magnetic coupling type. FIG. 18(c) shows a quadrature hybrid coupler of a wavelength-reduced magnetic coupling type. The quadrature hybrid couplers shown in FIGS. 18(a) to 18(c) are dividedly used according to a circuit size in a wireless communication terminal and a bandwidth of a signal used in wireless communication.

The quadrature hybrid coupler shown in FIG. 18(a) includes a signal input terminal TA1, a through terminal TA2, a coupling terminal TA3, an isolation terminal (insulation terminal) TA4, inductors L1 and L2, coupling capacitors CA1 and CA2, and shunt capacitors CB1, CB2, CB3 and CB4.

The through terminal TA2 represents an output I (OUT I) terminal, and the coupling terminal TA3 represents an output Q (OUT Q) terminal. A termination resistance is connected to the isolation terminal TA4. In the coupling capacitor CA1, parasitic capacitance between the signal input terminal TA1 and the isolation terminal TA4 is dominant. The shunt capacitors CB1, CB2, CB3 and CB4 are respectively provided between the respective terminals (TA1, TA2, TA3 and TA4) and the ground. The capacitive coupling type is a hybrid coupler suitable for handling of a radio frequency signal.

The quadrature hybrid coupler shown in FIG. 18(b) includes a signal input terminal TA10, a through terminal TA20, a coupling terminal TA30, an isolation terminal (insulation terminal) TA40, inductors L10 and L20, coupling capacitors CA10 and CA20, and shunt capacitors CB10, CB20, CB30 and CB40. A termination resistance is connected to the isolation terminal TA40. Coupling capacitance due to electromagnetic induction is dominant in the inductors L10 and L20. The shunt capacitors CB10, CB20, CB30 and CB40 are respectively provided between the respective terminals (TA10, TA20, TA30 and TA40) and the ground.

The quadrature hybrid coupler shown in FIG. 18(c) includes an input port TAP1 that is a signal input terminal, a direct port TAP2 that is an OUT I terminal, a coupling port TAP3 that is an OUT Q terminal, an isolation port TAP4 that is an insulation terminal an inductor of a coupling degree k, capacitances CC1 and CC2, capacitances CP1, CP2, CP3 and CP4, and capacitances CM1a and CM1b.

The capacitance CC1 is a capacitance between the input port TAP1 and the direct port TAP2, which may be a parasitic capacitance. The capacitance CC2 is a capacitance between the coupling port TAP3 and the isolation port TAP4, which may be a parasitic capacitance. The capacitances CC1 and CC2 form a resonance circuit.

The capacitance CM1a is a capacitance between the input port TAP1 and the coupling port TAP3. The capacitance CM1b is a capacitance between the direct port TAP2 and the isolation TAP4. Each of the capacitances CP1, CP2, CP3 and CP4 is a shunt capacitance between each port (terminal) and the ground.

In the quadrature hybrid couplers disclosed in Patent Literature 1 and Patent Literature 2, however, it is difficult to independently design values of an inductor, a transformer or a capacitor. This is because when the shape of the inductor or the transformer is optimally designed, the value of the capacitor is determined by the film thickness of an insulator between two spirals (components of the inductor or the transformer).

In a manufacturing process of a semiconductor device, a designer does not have much freedom to select a film thickness. Thus, it is difficult to sufficiently reduce an amplitude error of two output signals from a quadrature hybrid coupler and a phase error from 90 degrees (phase deviation), according to frequencies used in wireless communication.

Further, the quadrature hybrid coupler disclosed in Non-Patent Literature 1 employs a capacitor of a parallel flat metal-insulator-metal (MIM) type (type in which a conductor layer, an insulation layer and a conductor layer are sequentially layered) capacitor. In wireless communication, for example, when a high frequency of 60 GHz is used, capacitance necessary for the capacitor is reduced. The minimum size of the MIM capacitance is predetermined, and thus, when minute capacitance is necessary, a MOM (metal-on-metal) capacitor that uses a finger type wiring is used.

Further, when the related art MOM capacitor is used as the shunt capacitor of the quadrature hybrid coupler disclosed in Non-Patent Literature 1, a wiring that connects a transformer, the capacitor and the ground is lengthened. The amplitude error and the phase error of the quadrature hybrid coupler become worse by parasitic inductance and parasitic resistance of the wiring, for example. Accordingly, since impedance mismatch between an input side and an output side occurs, a countermeasure to match impedance is necessary, which makes design work complicated.

Accordingly, in respective embodiments described below, a quadrature hybrid coupler, an amplifier and a wireless communication device that reduces the length of each connection wiring to an induction device or the ground from a shunt capacitor inserted between the induction device and the ground, and reduces an amplitude error and a phase error of an output signal with respect to an input signal will be described.

Hereinafter, the respective embodiments of the present disclosure will be described with reference to the accompanying drawings.

First Embodiment

A quadrature hybrid coupler of the present embodiment inputs a radio frequency signal to an induction device (for example, a transformer or an inductor) that performs electromagnetic induction or mutual induction through a microstrip transmission line. The microstrip transmission line includes a ground (for example, a ground plane that is a common ground conductor), for example.

FIG. 1(a) is a layout diagram of a quadrature hybrid coupler of a magnetic coupling type according to the present embodiment, and FIG. 1(b) is a circuit diagram of the quadrature hybrid coupler of the present embodiment.

A quadrature hybrid coupler 100 shown in FIG. 1(a) or FIG. 1(b) includes a transformer 101 that is an induction device, coupling capacitors 102 and 103, shunt capacitors 104 to 107, a termination resistance 108, a ground 109 and transmission lines 110 to 112. The transmission lines 110 to 112 form the ground 109 and microstrip lines.

In the quadrature hybrid coupler 100 of the present embodiment, an input signal IN is input to the transmission line 110 from a terminal P1. An output signal OUT_I is output from a terminal P3 through the transmission line 112. An output signal OUT_Q is output from a terminal P2 through the transmission line 111. The phase of the output signal OUT_I is delayed by 90 degrees from the phase of the output signal OUT_Q.

A configuration of the quadrature hybrid coupler 100 will be described in detail.

The transformer 101 that is the inductor device includes a coil 101a, a coil 101b, and terminals T1, T2, T3 and T4. The induction device is not limited to the transformer 101, and for example, may be an inductor. Further, the induction device is not limited to the transformer 101 shown in FIG. 1 as long as plural wiring layers are formed in a spiral shape in parallel.

The microstrip transmission lines 110, 111 and 112 are respectively connected to the terminals T1, T2 and T3. The coupling capacitor 102 is disposed between the terminal T1 and the terminal T2, and the coupling capacitor 103 is disposed between the terminal T3 and the terminal T4.

The shunt capacitors 104, 105, 106 and 107 are disposed between the terminals T1, T2, T3 and T4 and the ground 109 of the microstrip transmission lines 110, 111 and 112, respectively.

The termination resistance 108 is disposed between the terminal T4 and the ground 109 of the microstrip transmission lines 110, 111 and 112.

The coupling capacitors 102 and 103 are formed using plural comb-shaped wirings of the same length. Further, the coupling capacitors 102 and 103 may be formed using plural zigzag wirings of the same length.

Figure 16:
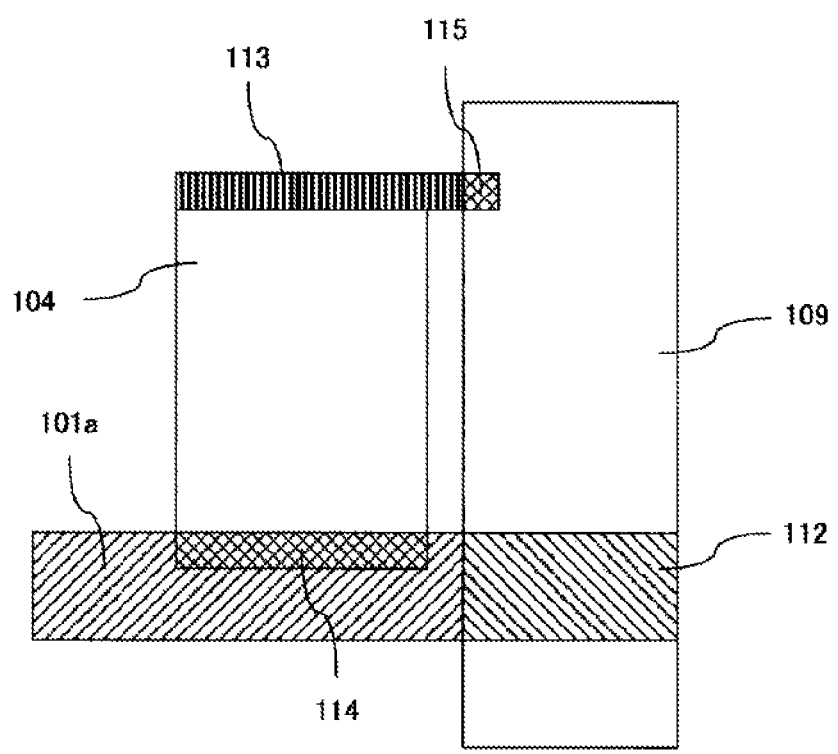
FIG. 16 is a diagram illustrating an example of a layout diagram of a shunt capacitor using a MOM capacitor.
Figure 17:
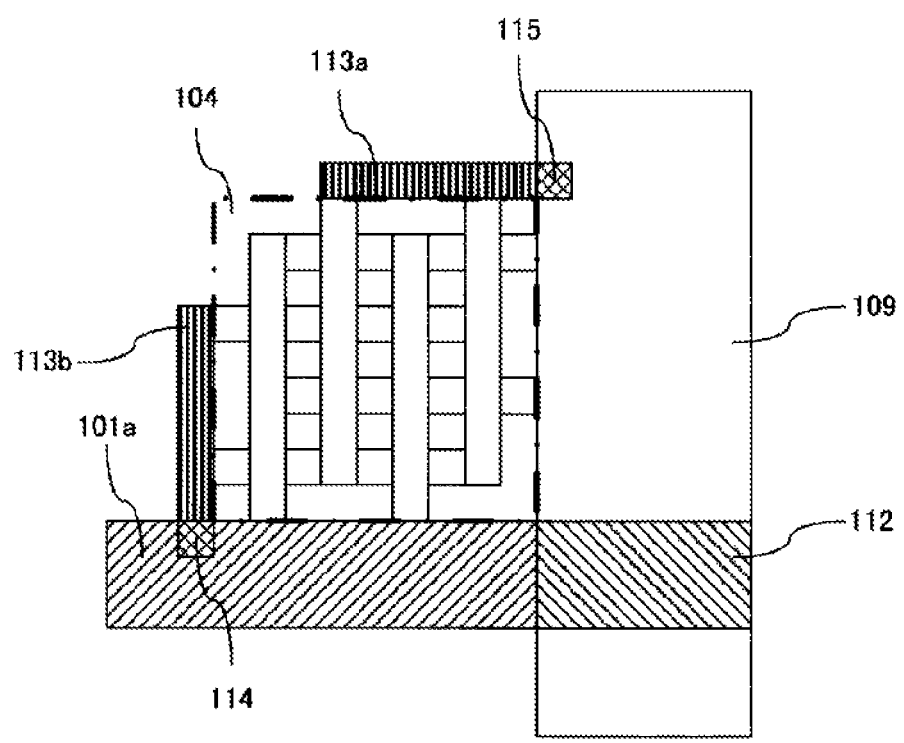
FIG. 17 is a diagram illustrating another example of the layout diagram of the shunt capacitor using the MOM capacitor.

Here, the problems to be solved by the present disclosure will be described in detail. FIGS. 16 and 17 show comparative examples of layouts of shunt capacitors. FIGS. 16 and 17 are the enlarged views of blocks surrounded by dashed lines in FIG. 1(a).

FIG. 16 is a diagram illustrating an example of a layout diagram of a shunt capacitor in which a MOM capacitor disclosed in Patent Literature 3 or Patent Literature 4 is used as the shunt capacitor 104. As a wiring of the MOM capacitor, a linear wiring is used in Patent Literature 3, and a zigzag wiring is used in Patent Literature 4.

In FIG. 16, terminals are provided on both sides with a shunt capacitor 104 being interposed therebetween. Thus, for example, if one end of the MOM capacitor is connected to a coil 101a, a wiring 113 for connecting the other end of the MOM capacitor to a ground 109 is necessary, and thus, it is difficult to reduce the length of the wiring when the shunt capacitor 104 is formed.

FIG. 17 is a diagram illustrating another example of a layout diagram when the MOM capacitor that uses a crossing wiring disclosed in Patent Literature 5 is used as the shunt capacitor 104. Similar to FIG. 16, wirings 113a and 113b for connecting the shunt capacitor 104 to a coil 101a that forms a transformer and a ground 109 are necessary, and thus, it is similarly difficult to reduce the length of the wiring.

Figure 1:
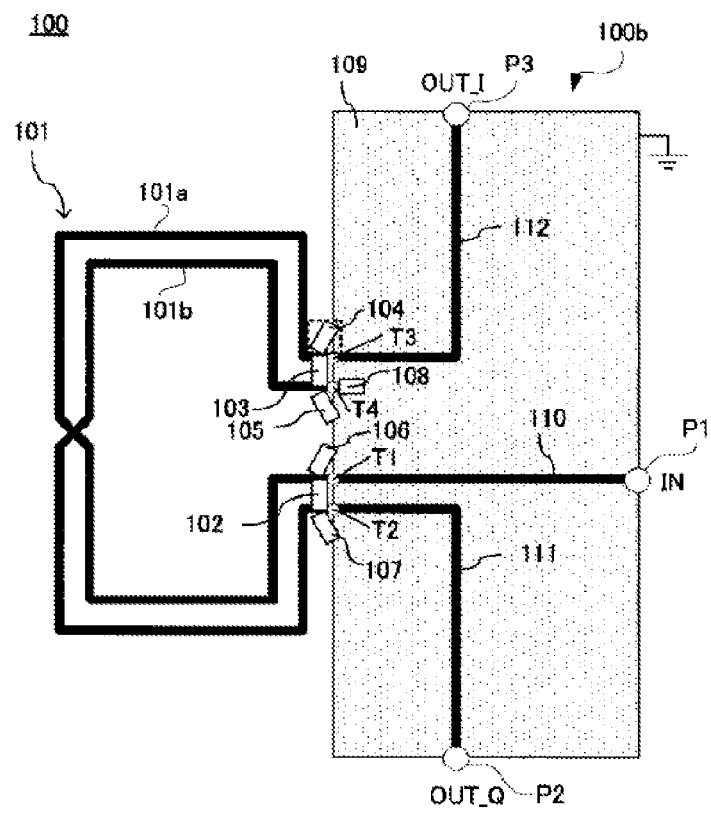
In FIG. 1, (a) is a layout diagram of a quadrature hybrid coupler of a magnetic coupling type according to a first embodiment, and (b) is a circuit diagram of the quadrature hybrid coupler of the first embodiment.
Figure 1:
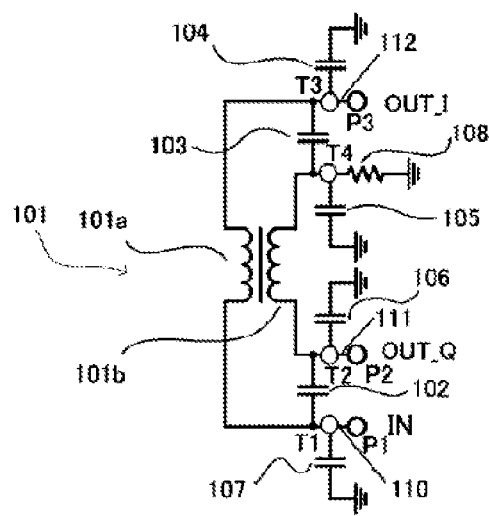

Next, a layout of a shunt capacitor of the quadrature hybrid coupler 100 of the present embodiment will be described in detail with reference to FIG. 2. FIG. 2(a) is a layout diagram of the shunt capacitor 104 in the quadrature hybrid coupler 100 of the first embodiment, FIG. 2(b) is a diagram illustrating a layout of the shunt capacitor 104, and FIG. 2(c) is a diagram illustrating crossing of wirings. In FIGS. 2(a) to 2(c), the shunt capacitor 104 among the shunt capacitors 104 to 107 shown in FIG. 1 is described as an example, but this description is similarly applied to the other shunt capacitors 105 to 107. Further, this description is similarly applied to the following respective embodiments.

The shunt capacitor 104 of the quadrature hybrid coupler 100 shown in FIG. 2(a) is disposed in an arrangement region AR for the shunt capacitor 104.

The shunt capacitor 104 shown in FIG. 2(a) includes metal wirings 121 and 122 provided in a first layer that is the lowest layer, and metal wirings 123 and 124 provided in a second layer that is a one-higher layer disposed over the lowest layer. The metal wiring 121 and the metal wiring 124 are connected to each other through vias 125a and 125c. The metal wiring 123 and the metal wiring 122 are connected to each other through vias 125b and 125d. Each of the vias 125a to 125d connects the first layer metal wirings and the second layer metal wirings, and specifically, connects respective corners of the metal wirings of zigzag shapes (hereinafter, referred to as "zigzag wirings"). The zigzag wiring will be described later.

The metal wirings 121 to 124 have a shape in which a linear portion of the wiring is alternately bent in a first direction and a second direction, which is a pattern, a so-called zigzag shape. The first direction is an extending direction of the coil 101a (linear portion of the coil 101a in FIG. 2(a)), which is an X direction in FIG. 2(a). The second direction is a longitudinal direction of the ground 109 of the microstrip transmission lines 110 to 112, that is, the ground plane that provides a common ground potential, which is a Y direction in FIG. 2(a). In FIG. 2(a), the X direction and the Y direction are at right angles, and a direction that is orthogonal to the two directions is a Z direction. The Z direction represents a direction that is vertical to a so-called paper plane.

The zigzag wiring will be described with reference to FIG. 2(c).

In the zigzag wiring, zigzag wirings ha1 to ha3 and hb1 to hb3 along the first direction (X direction), and zigzag wirings va1 to va3 and vb1 to vb3 along the second direction (Y direction) crossing the first direction are coupled to each other at corners. Namely, the zigzag wiring has a zigzag pattern in which the zigzag wiring along the first direction and the zigzag wiring along the second direction are alternately repeated.

The length of the zigzag wiring will be described with reference to FIG. 2(a). With respect to the lengths of the zigzag wirings 121 and 122 provided in the lowest layer (first layer), the zigzag wiring 121 is longer than the zigzag wiring 122. Further, with respect to the lengths of the zigzag wirings 123 and 124 provided in the layer (second layer) one-higher disposed over the lowest layer, the zigzag wiring 123 is longer than the zigzag wiring 124.

The zigzag wirings 121 and 124 are connected to the coil 101a through vias 126a and 126b, respectively. The zigzag wirings 122 and 123 are connected to the ground 109 through vias 127a and 127b, respectively.

The zigzag wiring 121 and the zigzag wiring 122 are arranged at an equal interval, and the zigzag wiring 124 and the zigzag wiring 123 are arranged at an equal interval. Accordingly, since the number of zigzag wirings arranged at equal intervals is increased, the shunt capacitor 104 has a high capacitance. Further, the high capacitance of the shunt capacitor 104 is suitable for reduction in size, which allows easy mounting in an integrated circuit (IC), for example.

Specifically, the shunt capacitor 104 has capacitance corresponding to the sum of capacitance generated on respective side surfaces of the zigzag wirings 121 and 122, capacitance generated on respective side surfaces of the zigzag wirings 123 and 124, capacitance generated at crossings in a layering direction of the first layer and the second layer of the zigzag wirings 121 and 123 (hereinafter, simply referred to as a "layering direction"), and capacitance generated at fringes (corners).

The capacitance generated in the fringes is a leakage capacitance generated between the side surface of one zigzag wiring and the upper layer or lower layer zigzag wiring with respect to the zigzag wiring, for example. Since the shunt capacitor 104 has the capacitance generated in the fringes, it is possible to increase the capacitance density.

Further, the shunt capacitor 104 in FIG. 2(b) is arranged in an arrow direction, that is, to obliquely rise in the arrangement region AR, with reference to the layering direction of the zigzag wirings. Thus, the linear portion of the coil 101a and the ground 109 are directly connected to each other by the shunt capacitor 104, and an extra connection wiring is unnecessary.

Thus, in the shunt capacitor 104, an extra wiring for connection to the transformer (coil) or the ground is unnecessary, compared with the layout of the shunt capacitors shown in FIG. 16 or 17, thereby reducing the length of the wiring. Accordingly, the shunt capacitor 104 can reduce the amplitude error and the phase error of the output signal with respect to the input signal. Further, this is similarly applied to connection of the other shunt capacitors 105 to 107 to the transformer (coil) or the ground.

Next, the zigzag wirings provided in the respective layers of the shunt capacitor 104 will be described with reference to FIGS. 3 to 6. Each of the shunt capacitors 104 to 107 has a configuration in which the plural zigzag wirings are layered. That is, in each of the shunt capacitors 104 to 107, N (N is an integer of 2 or greater) zigzag wirings are layered.

Figure 3:
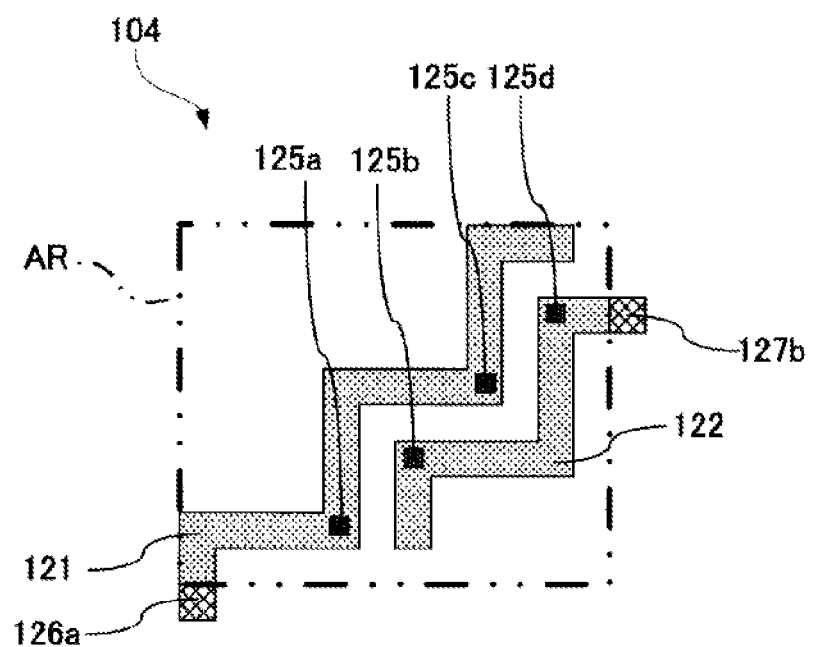
FIG. 3 is a layout diagram individually illustrating a wiring pattern of the lowest layer (a first layer) in a layout of a shunt capacitor.

FIG. 3 is a layout diagram individually illustrating a wiring pattern of the lowest layer (a first layer) in the layout of the shunt capacitor 104. In the arrangement region AR of the shunt capacitor 104 shown in FIG. 3, the zigzag wirings 121 and 122 are arranged as a wiring layer (wiring pattern) in each layer. Further, the vias 125a to 125d, the via 126a and the via 127b are provided. In the following description, each via includes a conductor layer or a non-conductor layer that forms a part of the via.

Figure 4:
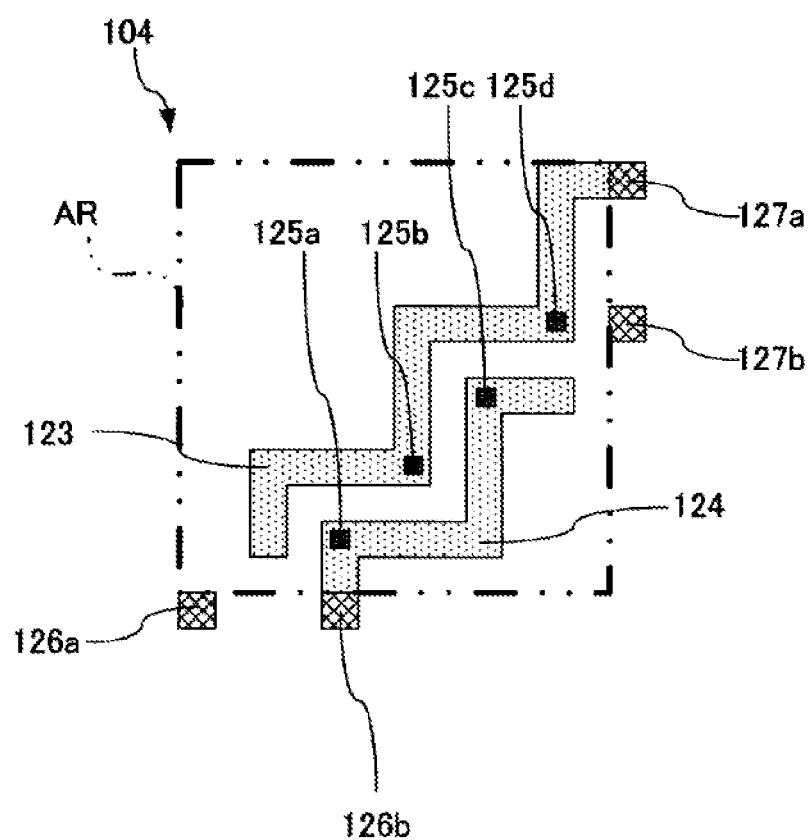
FIG. 4 is a layout diagram individually illustrating a wiring pattern of a one-higher layer (a second layer) disposed over the lowest layer in the layout of the shunt capacitor.

FIG. 4 is a layout diagram individually illustrating a wiring pattern of a one-higher layer (a second layer) disposed over the lowest layer in the layout of the shunt capacitor 104. In the arrangement region AR of the shunt capacitor 104 shown in FIG. 4, the zigzag wirings 124 and 123 are provided as a wiring layer (wiring pattern) in each layer. Further, the vias 126a to 126d, the via 126b and the via 127a are provided.

Figure 5:
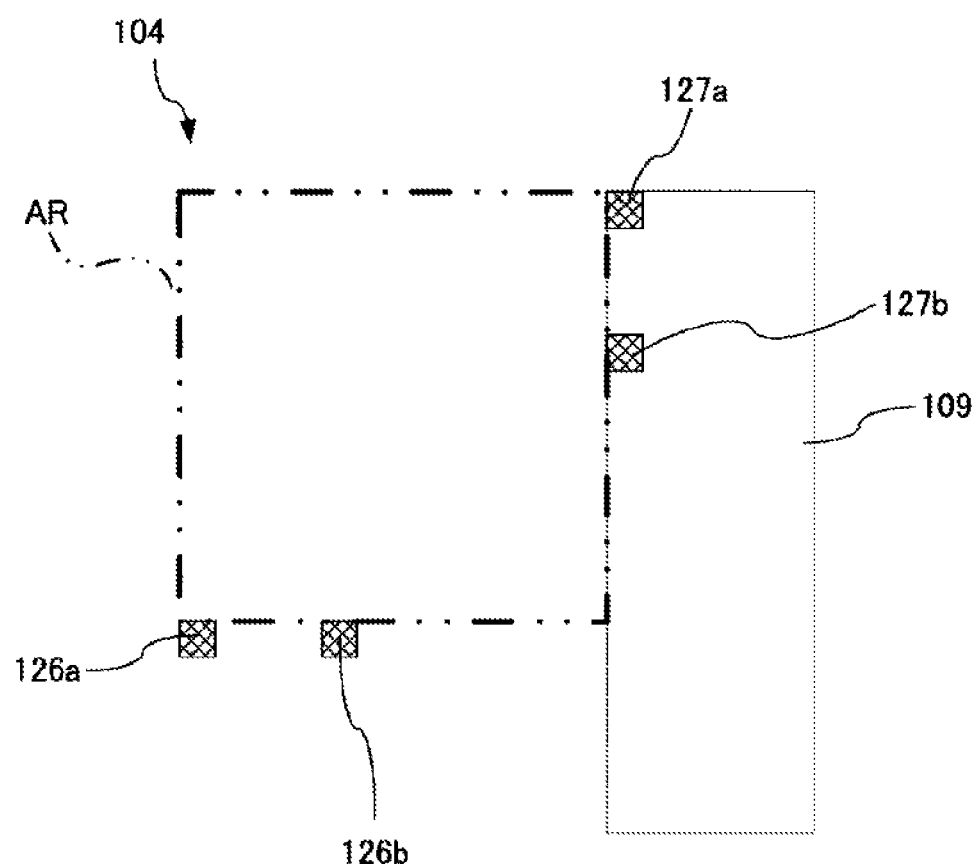
FIG. 5 is a layout diagram individually illustrating a wiring pattern of a two-higher layer (a third layer) disposed over the lowest layer in the layout of the shunt capacitor.

FIG. 5 is a layout diagram individually illustrating a wiring pattern of a two-higher layer (a third layer) disposed over the lowest layer in the layout of the shunt capacitor 104. In FIG. 5, the vias 126a and 126b, the vias 127a and 127b, and the ground 109 are provided in the vicinity of the arrangement region AR of the shunt capacitor 104.

Figure 6:
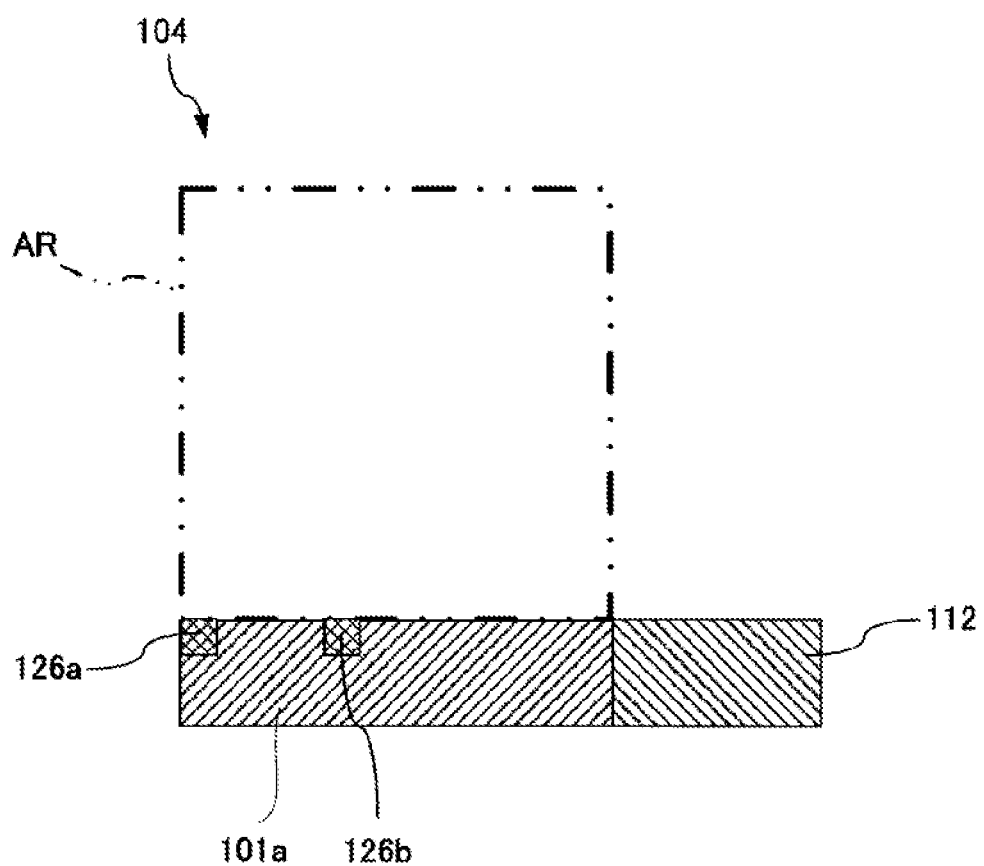
FIG. 6 is a layout diagram individually illustrating a wiring pattern of the highest layer (a fourth layer) in the layout of the shunt capacitor.

FIG. 6 is a layout diagram individually illustrating a wiring pattern of the highest layer (a fourth layer) in the layout of the shunt capacitor 104. In FIG. 6, the vias 126a and 126b, the coil 101a, and a part of the microstrip transmission lines (for example, the microstrip transmission line 112) are provided in the vicinity of the arrangement region AR of the shunt capacitor 104.

As described above, the shunt capacitors 104 to 107 of the quadrature hybrid coupler 100 of the present embodiment includes the K-th layer wiring of the zigzag shape provided in the K-th (K is any one of 1 to N−1) wiring layer, and the (K+1)-th layer wiring of the zigzag shape provided in the (K+1)-th wiring layer.

The K-th layer wiring includes the zigzag wiring 121 that is electrically connected to any one terminal (terminal T3 in the example in FIG. 2) of the terminals T1 to T3 by the via 126a, and the zigzag wiring 122 that is connected to the ground 109 of the microstrip transmission lines by the via 127b and is different in length from the zigzag wiring 121.

Further, the (K+1)-th layer wiring includes the zigzag wiring 124 that is electrically connected to any one terminal (terminal T3 in the example in FIG. 2) of the terminals T1 to T3 by the via 126b, and the zigzag wiring 123 that is connected to the ground of the microstrip transmission lines by the via 127a and is different in length from the zigzag wiring 124.

Any zigzag wiring of the zigzag wirings 121 to 124 has the zigzag pattern in which the zigzag wiring along the first direction and the zigzag wiring along the second direction crossing the first direction cross (combined) each other at corners three-dimensionally and the zigzag wiring along the first direction and the zigzag wiring along the second direction are alternately repeated (see FIG. 2(c)).

Further, in the quadrature hybrid coupler 100 shown in FIGS. 2(a) to 2(c), in the layering direction of the wiring layers, the zigzag wirings ha1 to ha3 and the zigzag wirings va1 to va3 of the zigzag wiring 121 cross, three-dimensionally, the zigzag wirings vb1 to vb3 and the zigzag wirings hb1 to hb3 of the zigzag wiring 124, respectively.

Similarly, in the quadrature hybrid coupler 100 shown in FIGS. 2(a) to 2(c), in the layering direction of the wiring layers, the zigzag wiring along the first direction and the zigzag wiring along the second direction of the zigzag wiring 122 cross, three-dimensionally, the zigzag wiring along the second direction and the zigzag wiring along the first direction of the zigzag wiring 124, respectively.

Thus, the shunt capacitors 104 to 107 of the three-dimensional structure are formed, and thus, it is possible to efficiently increase the capacitance density of the shunt capacitor 104. Preferably, the crossing angle of the first direction and the second direction is 90 degrees. Thus, it is possible to achieve design of a capacitor layout based on a layout rule in circuit design, and to improve performance of the quadrature hybrid coupler.

As described above, in the shunt capacitors 104 to 107 of the quadrature hybrid coupler 100 of the present embodiment, an extraction wiring from a lead-out wiring and a via to the transformer or the ground is unnecessary, and thus, it is possible to reduce parasitic inductance and parasitic resistance. Accordingly, the quadrature hybrid coupler 100 can reduce the amplitude error and the phase error of the output signal with respect to the input signal.

Further, the quadrature hybrid coupler 100 can improve impedance match between the input side and the output side. Further, the shunt capacitor shown in FIG. 2 uses the fringe capacitance of the zigzag wirings that cross each other as the capacitance of the shunt capacitor, and thus, it is possible to increase the capacitance (capacitance density) per unit area.

Further, the quadrature hybrid coupler 100 includes the vias 125a and 125c that connect the portions of the zigzag wiring 121 and the zigzag wiring 123, which cross each other three-dimensionally in the layering direction of the wiring layers, and the vias 125b and 125d that connect the portions of the zigzag wiring 122 and the zigzag wiring 123, which cross each other three-dimensionally.

Thus, the quadrature hybrid coupler 100 can increase the capacitance of the quadrature hybrid coupler 100 itself by the capacitance using the fringe portions. In the quadrature hybrid coupler 100, the vias 125a to 125d are not always necessary, but it is possible to increase the capacitance by using the capacitance generated by the side surfaces of the zigzag wiring.

Further, when plural metal wirings are usable as the shunt capacitor, the same layout as that of the lowest wiring layer is used in an odd-numbered wiring layer, and the same layout as that of the wiring layer one-higher disposed over the lowest layer is used in an even-numbered wiring layer. Thus, the shunt capacitors 104 to 107 can further increase the capacitance per unit area.

Further, it is preferable that the shape of the transformer 101 be symmetrical vertically. Thus, the quadrature hybrid coupler 100 can output signals having a phase difference of 90 degrees with the same amplitude, using the layout symmetry.

It is preferable that the transformer 101 be formed so that plural metal wiring layers of the semiconductor are layout in parallel and are divided into an upper layer and a lower layer at a crossing. That is, in the quadrature hybrid coupler 100, the induction device is preferably configured so that plural wiring layers are formed in parallel in a spiral shape. With such a configuration, it is possible to reduce the parasitic resistance of the transformer 101.

Further, the coupling capacitors 102 and 103 may employ a comb-shaped capacitor of the same length, or a zigzag capacitor of the same length. In particular, by using the comb-shaped capacitor, it is possible to increase the coupling capacitance. Further, it is similarly possible to achieve the same effect even using the zigzag shape.

It is preferable to provide a triangular space surrounded by the linear portion (coil 101a) of the tip of the coil 101a of the transformer 101, the ground 109, and any one of the shunt capacitors 104 to 107 (see FIG. 2(b)).

Thus, the length difference between the zigzag wirings is increased, that is, the length difference between the zigzag wiring 121 and the zigzag wiring 122 and the length difference between the zigzag wiring 123 and the zigzag wiring 124 are increased, and thus, it is possible to reduce decrease in self-resonant frequencies of the shunt capacitors 104 to 107.

Figure 2:
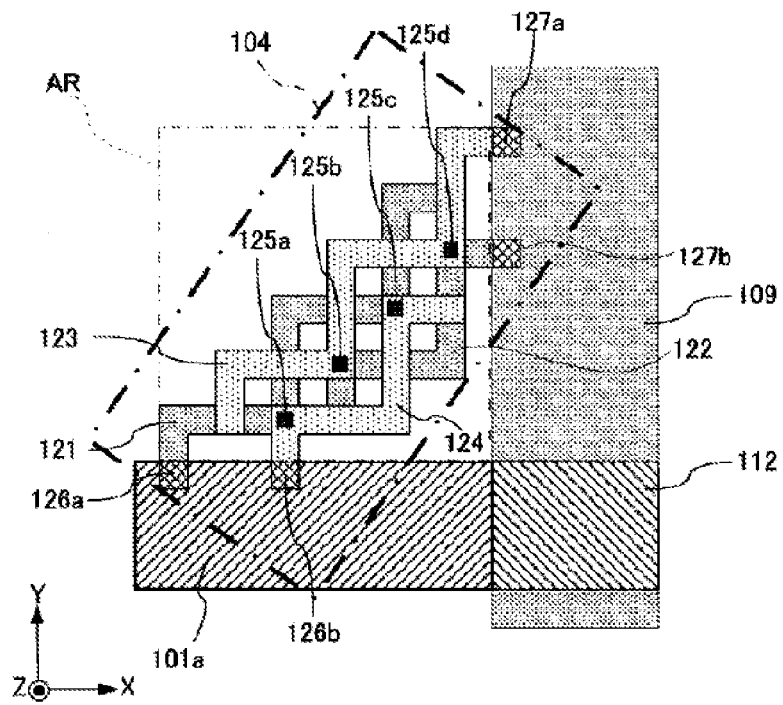
In FIG. 2, (a) is a layout diagram of a shunt capacitor in the quadrature hybrid coupler of the first embodiment, (b) is a diagram illustrating a layout of the shunt capacitor, and (c) is a diagram illustrating crossing of wiring.
Figure 2:
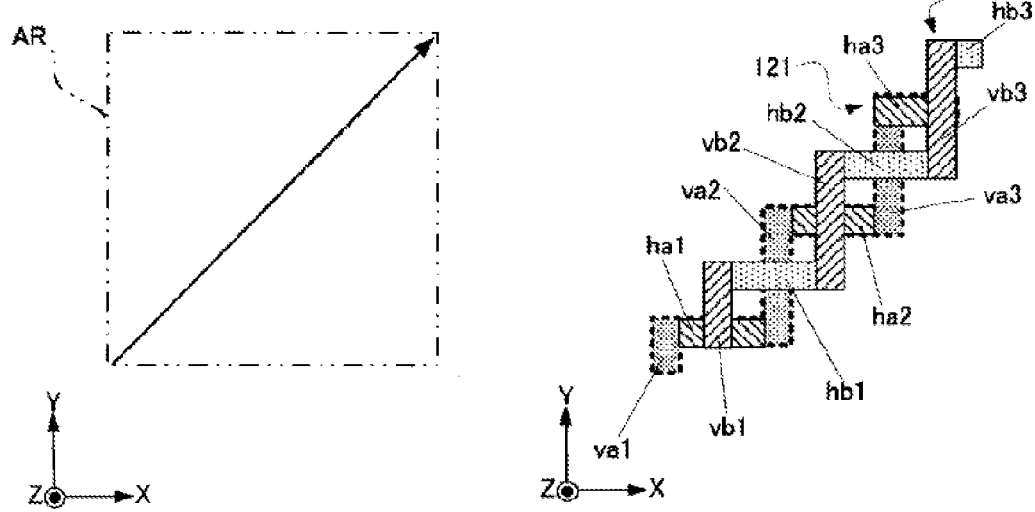

That is, even though the zigzag wirings 121 and 124 may be disposed near the ground 109 when the zigzag wirings 121 and 124 are connected to the coil 101a, and even though the zigzag wirings 122 and 123 may be disposed near the coil 101a when the zigzag wirings 122 and 123 are connected to the ground 109, the zigzag wirings are disposed as shown in FIG. 2 in consideration of the length difference between the zigzag wirings.

Figure 7:
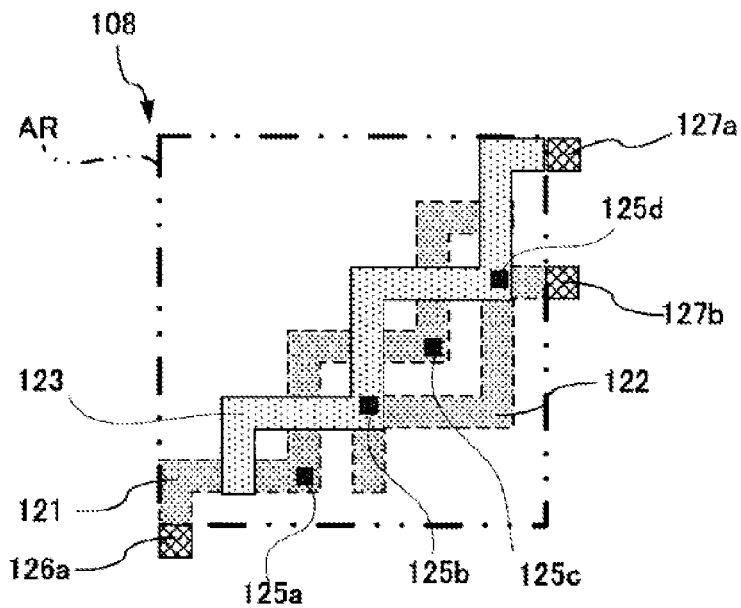
In FIG. 7, (a) is a diagram illustrating another example of the relationship between a zigzag wiring provided in an upper wiring layer and zigzag wirings provided in a lower wiring layer in the shunt capacitor of the first embodiment, and (b) is a diagram illustrating still another example of the relationship between a zigzag wiring provided in an upper wiring layer and zigzag wirings provided in a lower wiring layer in the shunt capacitor of the first embodiment.
Figure 7:
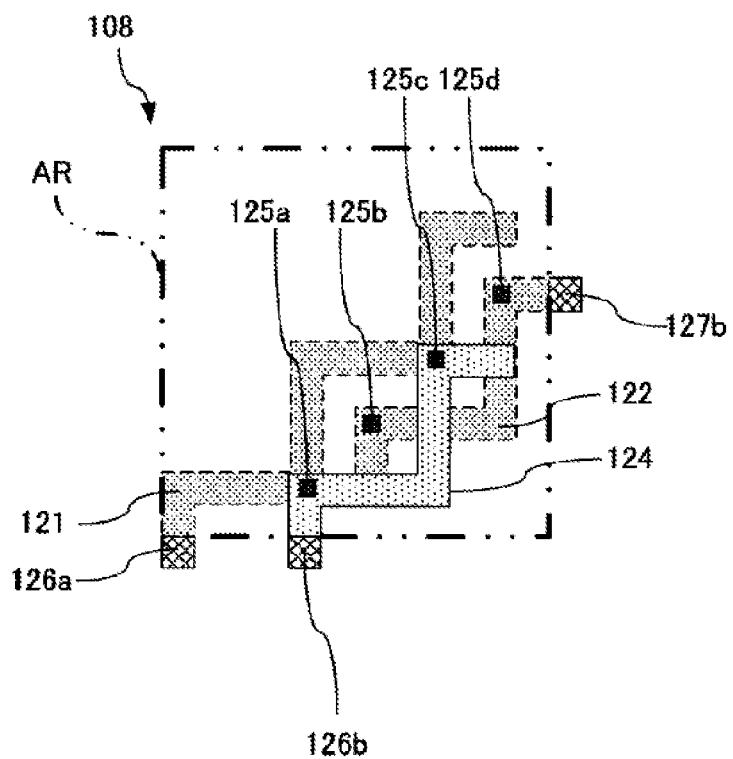

FIG. 7(a) is a diagram illustrating another example of the relationship between the zigzag wiring 123 provided in the upper wiring layer and the zigzag wirings 121 and 122 provided in the lower wiring layer in the shunt capacitor 104 of the first embodiment, and FIG. 7(b) is a diagram illustrating still another example of the overlap of the zigzag wiring 124 provided in the upper wiring layer and the zigzag wiring 121 and 122 provided in the lower wiring layer in the shunt capacitor 104 of the first embodiment.

In FIG. 7(a), in the layering direction of the wiring layers, the zigzag wiring 122 and the zigzag wiring 123 cross each other three-dimensionally at corners where an angle of 90 degrees is formed. Further, the zigzag wiring 121 and the zigzag wiring 123 cross each other three-dimensionally in linear portions of the respective wirings.

In FIG. 7(b), in the layering direction of the wiring layers, the zigzag wiring 121 and the zigzag wiring 124 cross each other three-dimensionally at corners where an angle of 90 degrees is formed. Further, the zigzag wiring 122 and the zigzag wiring 124 cross each other three-dimensionally in linear portions of the respective wirings. Accordingly, it is possible to form the quadrature hybrid coupler 100 with high density capacitance, and to improve performance of the quadrature hybrid coupler 100.

Modification Example 1 of the First Embodiment

Figure 8:
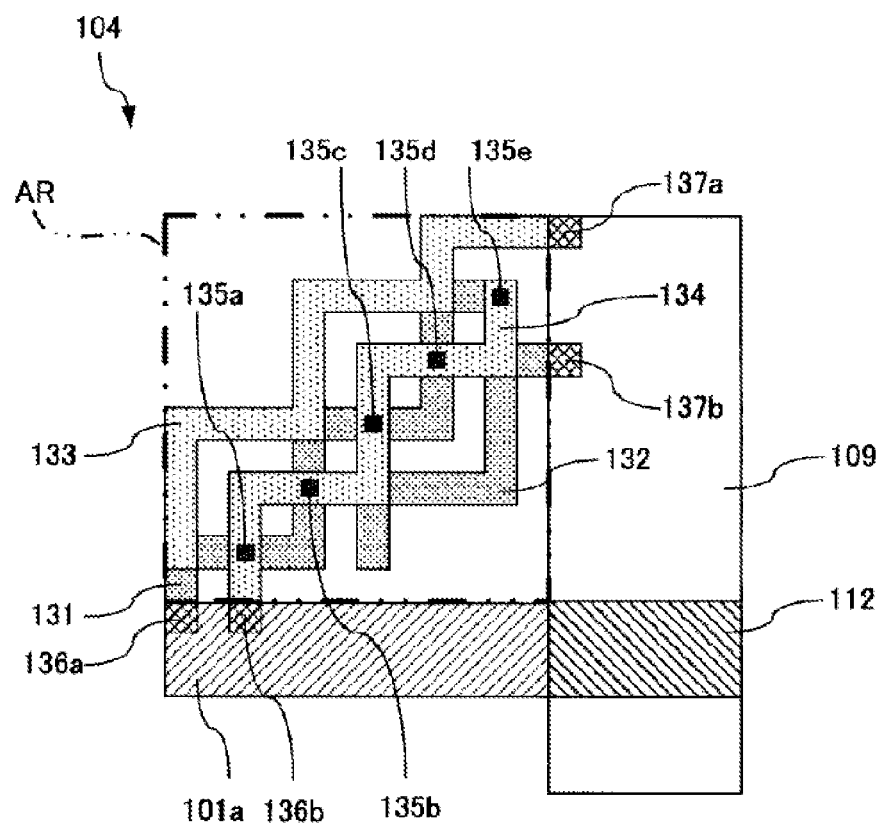
In FIG. 8, (a) is a layout diagram of a shunt capacitor of modification example 1, (b) is a diagram illustrating a corner of zigzag wirings provided in an upper wiring layer and zigzag wirings provided in a lower wiring layer, and (c) is a diagram illustrating a corner of another zigzag wiring provided in the upper wiring layer and another zigzag wiring provided in the lower wiring layer.
Figure 8:
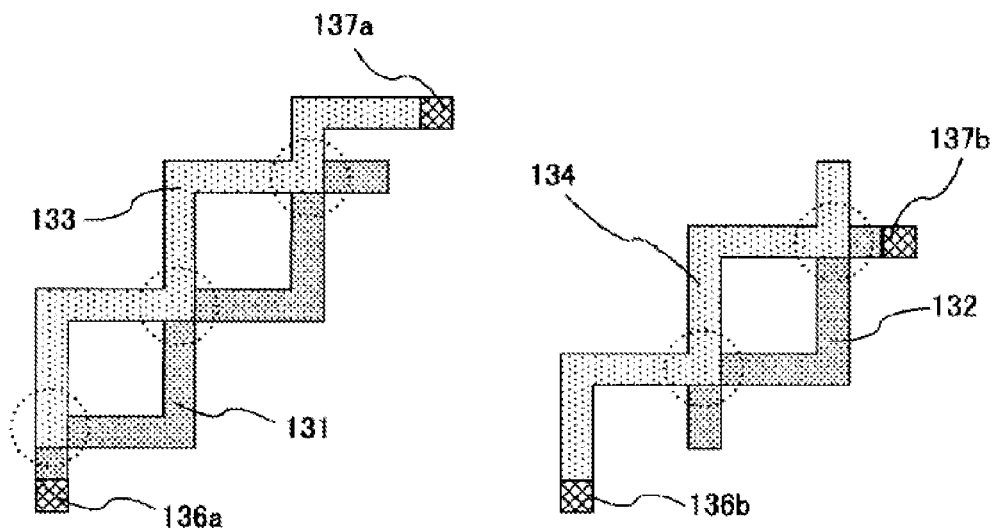

FIG. 8(a) is a layout diagram of the shunt capacitor 104 according to modification example 1 of the first embodiment. The shunt capacitor 104 shown in FIG. 8(a) includes zigzag wirings 131 and 132 provided in a first layer that is considered the lowest layer, and zigzag wirings 133 and 134 provided in a second layer that is a one-higher layer disposed over the lowest layer. The zigzag wiring 131 and the zigzag wiring 134 are connected to each other through vias 135a to 135e. Vias 136a and 136b connect the zigzag wirings 131 and 134 and a linear portion of the coil 101a.

Further, vias 137a and 137b connect the zigzag wirings 132 and 133 and the ground 109. The zigzag wiring 131 is longer than the zigzag wiring 132, and the zigzag wiring 133 is longer than the zigzag wiring 134. In the shunt capacitor 104 shown in FIG. 8(a), portions of the zigzag wiring 131 and the zigzag wiring 134, which cross each other three-dimensionally, are connected to each other by the vias 135a to 135e. That is, in the shunt capacitor 104 shown in FIG. 8(a), fringe capacitance generated at corners of the respective zigzag wirings that cross each other three-dimensionally is used.

Further, in the shunt capacitor 104 shown in FIG. 8(a), overlap capacitance generated at the respective corners (respective dotted portions of FIGS. 8(b) and 8(c)) of the zigzag wirings 131 and 133 (see FIG. 8(b)) and the zigzag wirings 132 and 134 (see FIG. 8(c)) is used.

As described above, in the shunt capacitor 104 of the present embodiment, a leading wiring from the shunt capacitor is unnecessary, similar to the shunt capacitor 104 shown in FIG. 2(a), and thus, it is possible to reduce the amplitude error and the phase error, and to achieve a high capacitance compared with the shunt capacitor 104 shown in FIG. 2(a).

Modification Example 2 of the First Embodiment

Figure 9:
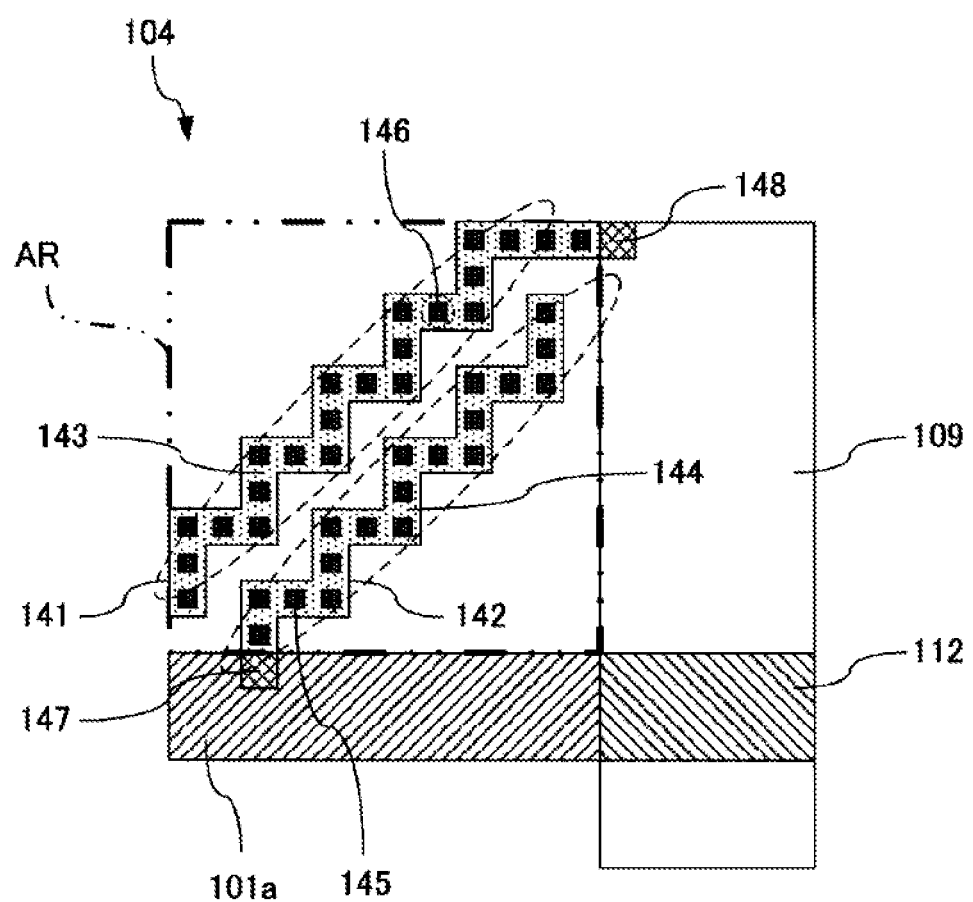
FIG. 9 is a layout diagram of a shunt capacitor of modification example 2.

FIG. 9 is a layout diagram of the shunt capacitor 104 according to modification example 2 of the first embodiment. The shunt capacitor 104 shown in FIG. 9 includes zigzag wirings 141 and 142 provided in a first layer that is the lowest layer, and zigzag wirings 143 and 144 provided in a second layer that is a one-higher layer disposed over the lowest layer. The zigzag wirings 141 and 142 and the zigzag wirings 143 and 144 are connected to each other through vias 145 and 146 (rectangular portions in dashed lines in FIG. 9). The zigzag wirings 141 and 142 and the zigzag wirings 143 and 144 overlap each other three-dimensionally over the entire length.

A via 147 connects the zigzag wirings 142 and 144 and the coil 101a. A via 148 connects the zigzag wirings 141 and 143 and the ground 109. The zigzag wiring 141 is longer than the zigzag wiring 142, and the zigzag wiring 143 is longer than the zigzag wiring 144.

In the dashed portions in FIG. 9, the plural vias 145 and 146 connect the zigzag wirings 141 and 142 and the zigzag wirings 143 and 144 to overlap each other three-dimensionally. This is different from the layout of the shunt capacitor 104 shown in FIG. 2(a) in that the zigzag wirings 141 and 142 and the zigzag wirings 143 and 144 overlap each other three-dimensionally in the layering direction of the wiring layers and both the zigzag wirings are connected to each other by the vias 145 and 146. Thus, in the shunt capacitor 104 shown in FIG. 9, it is possible to further use capacitance between the adjacent vias, thereby forming high density capacitance.

As described above, in the shunt capacitor 104 of the present embodiment, an extraction wiring from the shunt capacitor is unnecessary, similar to the shunt capacitor 104 shown in FIG. 2(a). Thus, it is possible to reduce the amplitude error and the phase error, and to achieve a high capacitance compared with the shunt capacitor 104 shown in FIG. 2(a).

Modification Example 3 of the First Embodiment

Figure 10:
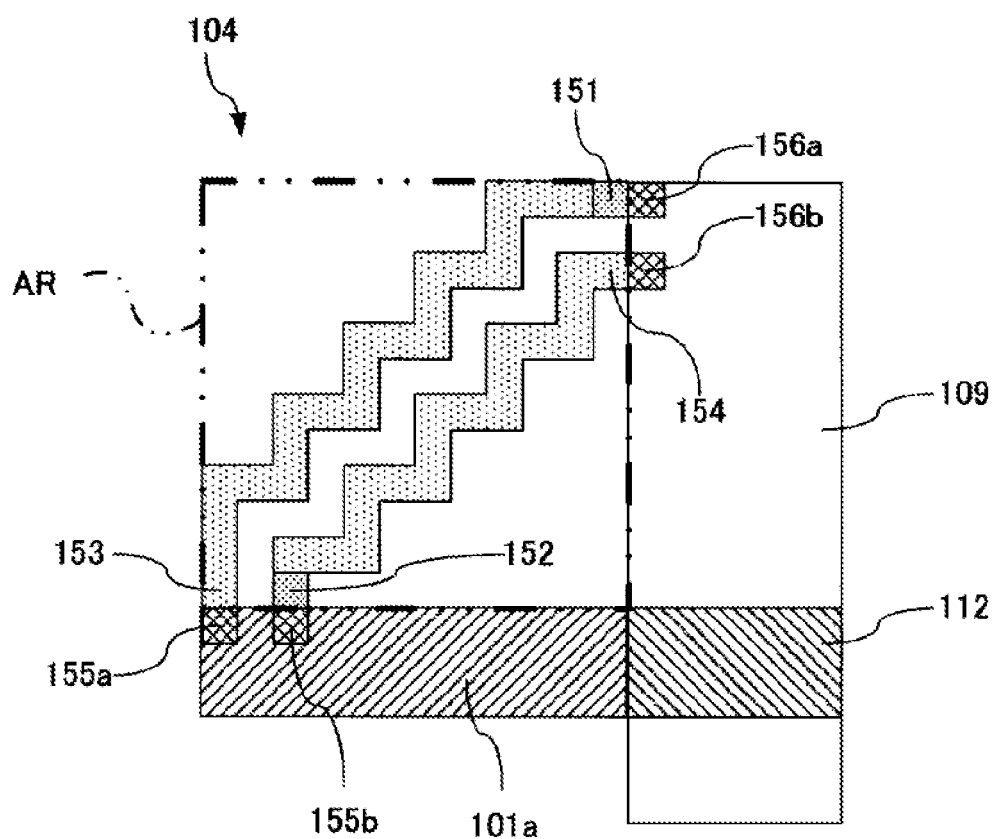
FIG. 10 is a layout diagram of a shunt capacitor of modification example 3.

FIG. 10 is a layout diagram of the shunt capacitor 104 according to modification example 3 of the first embodiment. In FIG. 10, for ease of understanding of the shunt capacitor 104, a partial perspective view is used.

The shunt capacitor 104 shown in FIG. 10 includes zigzag wirings 151 and 152 provided in a first layer that is the lowest layer, and zigzag wirings 153 and 154 provided in a second layer that is a one higher layer disposed over the lowest layer. The zigzag wirings 152 and 153 and the coil 101a are connected to each other through vias 155a and 155b. The zigzag wirings 151 and 154 and the ground 109 are connected to each other through vias 156a and 156b.

The zigzag wiring 151 and the zigzag wiring 153 overlap each other three-dimensionally in a portion except a portion where the zigzag wiring 151 of FIG. 10 is indicated. That is, the zigzag wiring 153 overlaps the zigzag wiring 151 three-dimensionally so as not to be connected to the ground 109, and the zigzag wiring 151 overlaps the zigzag wiring 153 three-dimensionally so as not to be connected to the coil 101a.

Further, the zigzag wiring 152 and the zigzag wiring 154 overlap each other three-dimensionally in a portion except a portion where the zigzag wiring 152 of FIG. 10 is indicated. That is, the zigzag wiring 152 overlaps the zigzag wiring 154 three-dimensionally so as not to be connected to the ground 109, and the zigzag wiring 154 overlaps the zigzag wiring 152 three-dimensionally so as not to be connected to the coil 101a.

The zigzag wiring 151 is longer than the zigzag wiring 152, and the zigzag wiring 153 is longer than the zigzag wiring 154.

Thus, in the shunt capacitor 104 shown in FIG. 10, it is possible to use capacitance provided between the first layer and the second layer. This is different from the layout of the shunt capacitor 104 shown in FIG. 2(a) in that the zigzag wirings 151 and 152 and the zigzag wirings 153 and 154 overlap each other three-dimensionally in the layering direction of the wiring layers. Thus, in the shunt capacitor 104 shown in FIG. 10, it is possible to obtain large capacitance by the zigzag wirings 151 and 152 and the zigzag wirings 153 and 154 that vertically overlap each other, and to reduce an area necessary for obtaining the capacitance.

Further, the shunt capacitor 104 shown in FIG. 10 is different from the shunt capacitor 104 shown in FIG. 9 in that vias for connecting the zigzag wirings of the first layer and the second layer may be unnecessary.

As described above, in the shunt capacitor 104 of the present embodiment, a leading wiring from the shunt capacitor is unnecessary in a simple structure, similar to the shunt capacitor 104 shown in FIG. 2(a), and thus, it is possible to reduce the amplitude error and the phase error, and to achieve a high capacitance compared with the shunt capacitor 104 shown in FIG. 2(a).

Modification Example 4 of the First Embodiment

Figure 11:
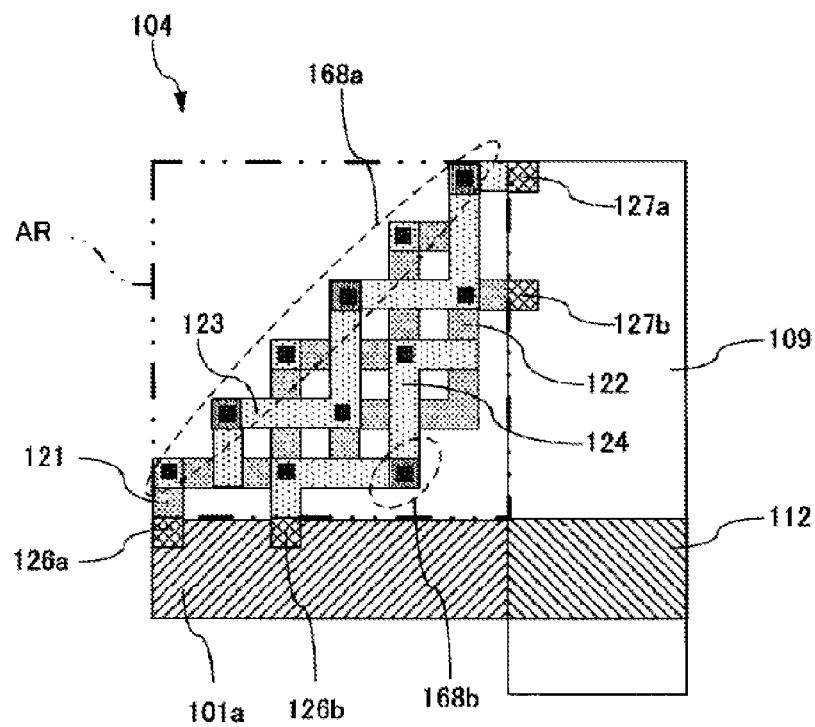
In FIG. 11, (a) is a layout diagram of a shunt capacitor of modification example 4, (b) is a diagram illustrating a positional relationship between floating wirings provided in a first layer that is the lowest layer and vias.
Figure 11:
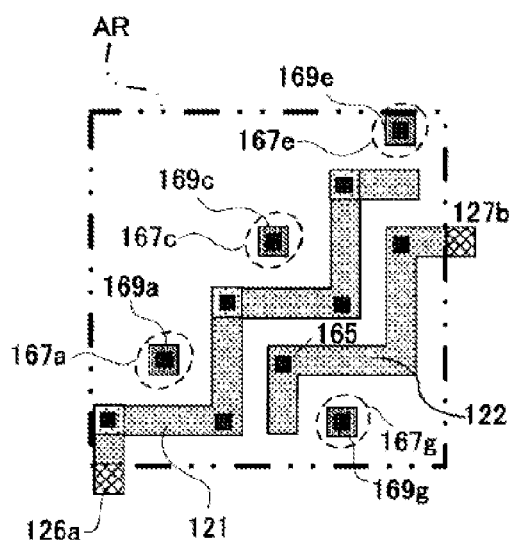
Figure 11:
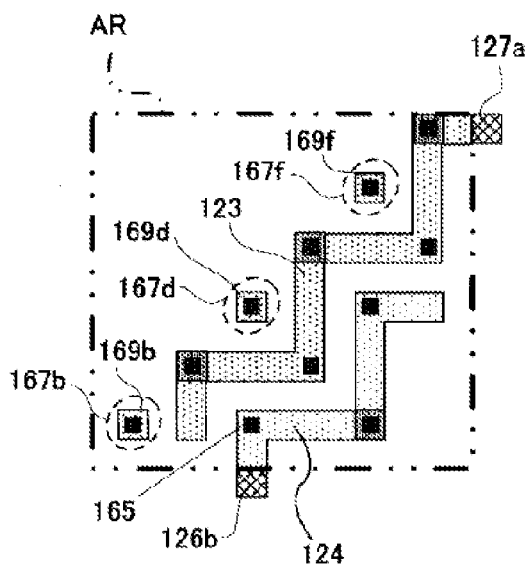

FIG. 11(a) is a layout diagram of modification example of 4 of the shunt capacitor 104 of the first embodiment. FIG. 11(b) is a diagram illustrating a positional relationship between floating wirings and vias provided in a first layer that is the lowest layer. FIG. 11(c) is a diagram illustrating a positional relationship between floating wirings and vias provided in a second layer that is a one-higher layer disposed over the lowest layer.

The shunt capacitor 104 shown in FIG. 11(a) includes zigzag wirings 121 and 122 provided in a first layer that is the lowest layer, zigzag wirings 123 and 124 provided in a second layer that is a one-higher layer disposed over the lowest layer, floating wirings 167a, 167c, 167e and 167g provided in the first layer, and floating wirings 167b, 167d and 167f provided in the second layer.

The floating wirings 167a, 167c, 167e and 167g shown in FIG. 11(b) are provided in the same layer of the zigzag wirings 121 and 122, and the floating wirings 167b, 167d and 167f shown in FIG. 11(c) are provided in the same layer of the zigzag wirings 123 and 124.

A multilayered substrate includes four layers, but the floating wirings and the zigzag wirings are arranged in two layers.

A specific configuration of the shunt capacitor 104 shown in FIG. 11(a) will be described with reference to FIGS. 11(b) and 11(c).

The floating wirings 167a, 167c and 167e shown in FIG. 11(b) are provided at positions corresponding to bent portions at the corners of 90 degrees of the zigzag wiring 123 of the second layer in the layering direction of the wiring layers, in the periphery of the zigzag wiring 121 of the first layer in the arrangement region AR. The floating wiring 167g shown in FIG. 11(b) is provided at a position corresponding to a bent portion at the corner of 90 degrees of the zigzag wiring 124 of the second layer in the layering direction of the wiring layers, in the periphery of the zigzag wiring 122 of the first layer in the arrangement region AR.

Similarly, the floating wirings 167b, 167d and 167f shown in FIG. 11(c) are provided at positions corresponding to bent portions at the corners of 90 degrees of the zigzag wiring 121 of the first layer in the layering direction of the wiring layers, in the periphery of the zigzag wiring 123 of the second layer in the arrangement region AR.

Vias 169a, 169c and 169e connect the floating wirings 167a, 167c and 167e and the bent portions of the zigzag wiring 123 provided in the second layer corresponding to the respective positions of the floating wirings 167a, 167c and 167e in the layering direction of the wiring layers. A via 169g connects the floating wiring 167g and the bent portion of the zigzag wiring 124 provided in the second layer corresponding to the position of the floating wiring 167g in the layering direction of the wiring layers.

Similarly, vias 169b, 169d and 169f connect the floating wirings 167b, 167d and 167f and the bent portions of the zigzag wiring 123 provided in the first layer corresponding to the respective positions of the floating wirings 167b, 167d and 167f in the layering direction of the wiring layers.

The shunt capacitor 104 shown in FIG. 11(a) has a configuration in which the floating wirings and the vias that connect the floating wirings provided in the respective wiring layers and the wiring layers are added to the configuration of the layout of the shunt capacitor 104 shown in FIG. 2. In the shunt capacitor 104 shown in FIG. 11(a), by using the floating wirings and the vias, it is possible to increase capacitance per unit area, compared with the shunt capacitor 104 shown in FIG. 2(a).

Second Embodiment

Figure 12:
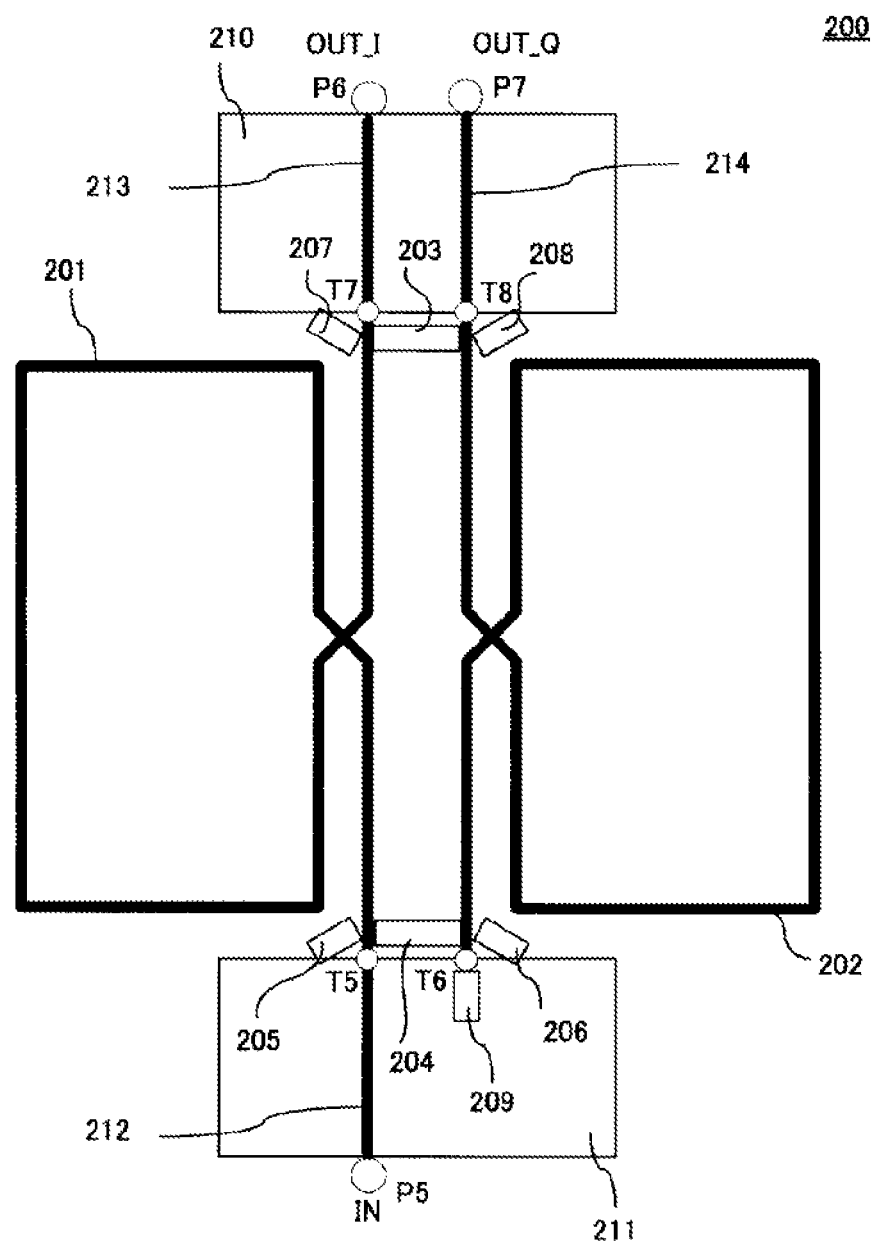
FIG. 12 is a layout diagram of a quadrature hybrid coupler of a second embodiment.

FIG. 12 is a diagram illustrating a layout example of a quadrature hybrid coupler 200 according to a second embodiment. The quadrature hybrid coupler 200 is a coupler of a capacitive coupling type.

The quadrature hybrid coupler 200 shown in FIG. 12 includes inductors 201 and 202 as an induction device, coupling capacitors 203 and 204, shunt capacitors 205, 206, 207 and 208, a termination resistance 209, and grounds 210 and 211. Transmission lines 212, 213 and 214 and the grounds 210 and 211 function as a microstrip transmission line.

By applying the layout (see any drawing among FIG. 2 and FIGS. 7 to 11) provided with the shunt capacitors 104 to 107 described in the first embodiment and the respective modification examples, specifically, zigzag wirings of different lengths to the shunt capacitors 205 to 208 shown in FIG. 12, it is possible to reduce parasitic inductance and parasitic resistance, and to reduce the amplitude error and the phase error.

Third Embodiment

Figure 13:
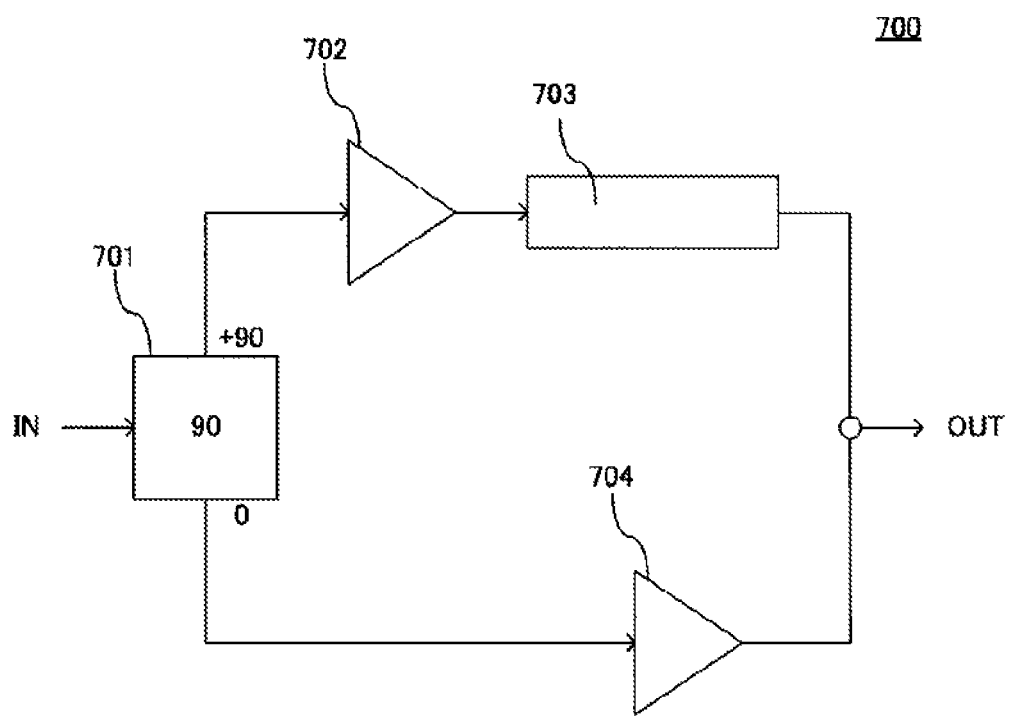
FIG. 13 is a block diagram of a Doherty amplifier using the quadrature hybrid coupler.

FIG. 13 is a block diagram of a Doherty amplifier 700 using the quadrature hybrid coupler in the above-described embodiments. The Doherty amplifier 700 includes a quadrature hybrid coupler 701 according to any one of the above-described embodiments, a main amplifier 702, a ¼ wavelength transmission line 703, and a peak amplifier 704.

An input RF signal input to the Doherty amplifier 700 is divided into two output signals in the quadrature hybrid coupler 701. One output signal is input to the main amplifier 702, and the other output signal is input to the peak amplifier 704. The phase of the signal input to the main amplifier 702 is advanced by 90 degrees with respect to the input RF signal. The phase of the signal input to the peak amplifier 704 is the same as that of the input RF signal.

The signal amplified in the main amplifier 702 is delayed by 90 degrees in the ¼ wavelength transmission line 703 to be output, and is combined with the signal amplified in the peak amplifier 704 to obtain a final output signal.

In the Doherty amplifier 700, if a phase error occurs between two output signals in the quadrature hybrid coupler, combination loss occurs in the final output signal. By using the quadrature hybrid coupler 701 of the above-described embodiment, the Doherty amplifier 700 can reduce output loss, and can improve amplification performance.

Fourth Embodiment

Figure 14:
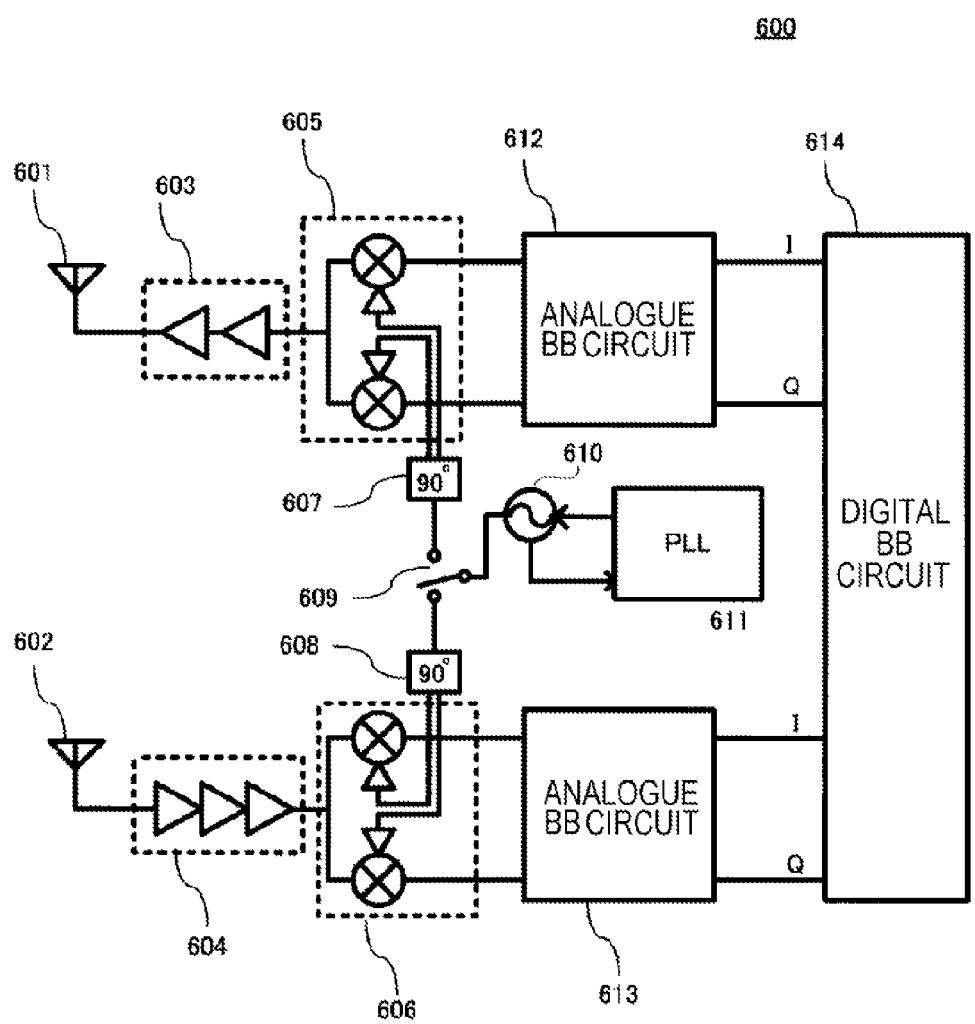
FIG. 14 is a block diagram of a wireless communication device using the quadrature hybrid coupler.

FIG. 14 is a block diagram of a wireless communication device 600 using quadrature hybrid couplers 607 and 608 according to any one of the above-described embodiments. The wireless communication device 600 shown in FIG. 14 includes a transmission RF amplifier 603 to which a transmission antenna 601 is connected, a quadrature modulator 605, the quadrature hybrid couplers 607 and 608 of each embodiment described above, a switch 609, an oscillator 610, a phase locked loop (PLL) 611, analogue baseband circuits 612 and 613, a digital baseband circuit 614, a quadrature demodulator 606, and a reception RF amplifier 604 to which a reception antenna 602 is connected. The switch 609, the oscillator 610 and the phase locked loop (PLL) 611 form a local signal generator that generates a local signal.

An operation of the wireless communication device 600 shown in FIG. 14 will be described. The local signal generated by the oscillator 610 and the PLL 611 is output to a transmission circuit or a reception circuit through the switch 609. The transmission circuit of the wireless communication device 600 includes the transmission RF amplifier 603 to which the transmission antenna 601 is connected, the quadrature modulator 605, the quadrature hybrid coupler 607 and the analogue baseband circuit 612.

When the local signal is output to the transmission circuit, the local signal is divided into different two signals having the same amplitude and a phase difference of 90 degrees by the quadrature hybrid coupler 607, and is input to the quadrature modulator 605. That is, the quadrature hybrid coupler 607 generates two output signals having the same amplitude and the phase difference of 90 degrees on the basis of the local signal, and outputs the signals to the quadrature modulator 605. The quadrature modulator 605 quadrature-modulates the transmission signal on the basis of the two output signals from the quadrature hybrid coupler 607, and outputs the result to the transmission RF amplifier 603.

When the local signal is output to the reception circuit, the local signal is divided into different two signals having the same amplitude and a phase difference of 90 degrees by the quadrature hybrid coupler 608, and is input to the quadrature demodulator 606. The reception circuit of the wireless communication device 600 includes the reception RF amplifier 604 to which the reception antenna 602 is connected, the quadrature demodulator 606, the quadrature hybrid coupler 608 and the analogue baseband circuit 613. The quadrature hybrid coupler 608 generates two output signals having the same amplitude and a phase difference of 90 degrees on the basis of the local signal, and outputs the signals to the quadrature demodulator 606. The quadrature demodulator 606 quadrature-demodulates the reception signal on the basis of the two output signals from the quadrature hybrid coupler 608, and outputs the result to the analogue baseband circuit 613.

The transmission baseband signal generated by the digital baseband circuit 614 is digital-analogue-converted, amplified and filtered by the analogue baseband circuit 612. The output signal from the analogue baseband circuit 612 is converted to a transmission RF signal in the quadrature modulator 605, is amplified in the transmission RF amplifier 603, and then is radiated from the antenna 601.

A reception RF signal received by the antenna 602 is amplified in the reception RF amplifier 604, is input to the quadrature demodulator 606, and is converted to a baseband signal in the quadrature demodulator 606. The baseband signal is analogue-digital-converted, amplified and filtered by the analogue baseband circuit 613, and then is digital-demodulated in the digital baseband circuit 614.

By applying the quadrature hybrid coupler of the above-described embodiment to the wireless communication device 600 shown in FIG. 14, it is possible to improve modulation accuracy of the quadrature modulator 605 and demodulation accuracy of the quadrature demodulator 606. Thus, the wireless communication device 600 can improve signal quality of the transmission signal, and can improve reception sensitivity.

Modification Example of the Fourth Embodiment

Figure 15:
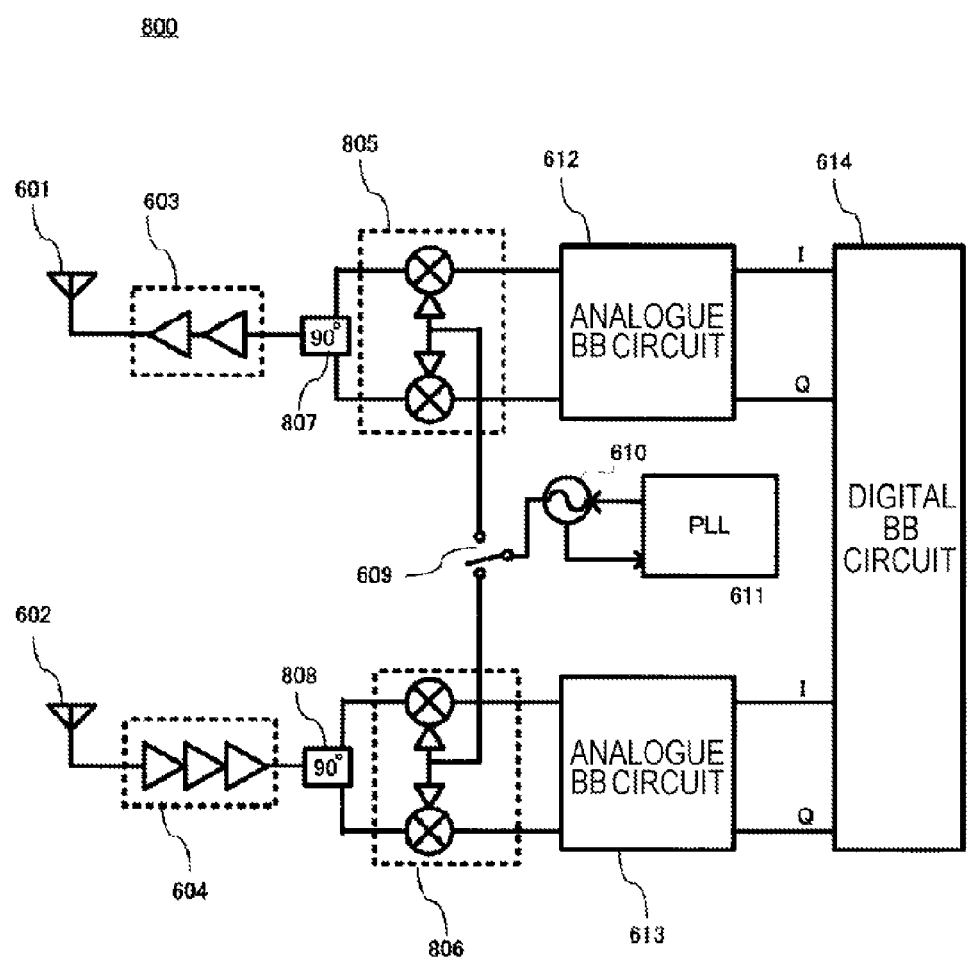
FIG. 15 is a block diagram of a modification example of a wireless communication device using the quadrature hybrid coupler.

FIG. 15 is a block diagram of a modification example of a wireless communication device 800 using the quadrature hybrid coupler of the above-described embodiment. This is different from the wireless communication device 600 shown in FIG. 14 in that a quadrature hybrid coupler 807 instead of the quadrature hybrid coupler 607 is inserted between the transmission RF amplifier 603 and a quadrature modulator 805 and a quadrature hybrid coupler 808 instead of the quadrature hybrid coupler 608 is inserted between the reception RF amplifier 604 and a quadrature demodulator 806.

In description of the wireless communication device 800 shown in FIG. 15, the content different from the wireless communication device 600 shown in FIG. 14 will be described, and description about the same content will be omitted.

The wireless communication device 800 shown in FIG. 15 includes the transmission RF amplifier 603 to which the transmission antenna 601 is connected, the quadrature modulator 805, the quadrature hybrid couplers 807 and 808 of each embodiment described above, the switch 609, the oscillator 610, the phase locked loop (PLL) 611, the analogue baseband circuits 612 and 613, the digital baseband circuit 614, the quadrature demodulator 806, and the reception RF amplifier 604 to which the reception antenna 602 is connected. The switch 609, the oscillator 610 and the phase locked loop (PLL) 611 form a local signal generator that generates a local signal.

The wireless communication device 800 shown in FIG. 15 is effectively used in a case where the quadrature modulator 805 and the quadrature demodulator 806 are sub-harmonic mixers, that is, mixers in which an input frequency of the local signal corresponds to a value obtained by dividing an RF frequency by an integer.

A transmission circuit of the wireless communication device 800 includes the transmission RF amplifier 603 to which the transmission antenna 601 is connected, the quadrature hybrid coupler 807, the quadrature modulator 805, and the analogue baseband circuit 612.

The quadrature modulator 805 quadrature-modulates two input signals (transmission signals) having a phase difference of 90 degrees on the basis of the local signal generated by the local signal generator, and outputs the result to the quadrature hybrid coupler 807.

The quadrature hybrid coupler 807 inputs the two input signals having the phase difference of 90 degrees output from the quadrature modulator 805, and advances or delays one input signal of the two input signals by 90 degrees to adjust the phase difference of the two input signals to 0 degree. The quadrature hybrid coupler 807 combines two input signals after phase adjustment, and outputs one output signal to the transmission RF amplifier 603. The transmission RF amplifier 603 amplifies the output signal from the quadrature hybrid coupler 807.

Further, a reception circuit of the wireless communication device 800 includes the reception RF amplifier 604 to which the reception antenna 602 is connected, the quadrature hybrid coupler 808, the quadrature demodulator 806, and the analogue baseband circuit 613. The quadrature hybrid coupler 808 generates two reception signals having the same amplitude and a phase difference of 90 degrees from an input reception signal, and outputs the result to the quadrature demodulator 806. The quadrature demodulator 806 quadrature-demodulates the reception signal on the basis of the two reception output signals from the quadrature hybrid coupler 808 and outputs the result to the analogue baseband circuit 613.

By applying the quadrature hybrid coupler of the above-described each embodiment to the wireless communication device 800 shown in FIG. 15, it is possible to reduce output loss when two output signals from the quadrature modulator 805 are combined, and to improve signal division accuracy of the output signal from the reception RF amplifier 604.

Hereinbefore, various embodiments have been described with reference to the accompanying drawings, but the present disclosure is not limited to these examples. It will be obvious to those skilled in the art that modification examples or revision examples and combination examples of the various embodiments may be made within a range without departing from the disclosure of claims, which are considered to be included in the technical scope of the present disclosure.

The applied range of the quadrature hybrid coupler of the above-described respective embodiments is wide, and for example, may be used as a complex mixer. Further, for example, the quadrature hybrid coupler of the above-described respective embodiments may be also used as a circuit that freely creates a phase difference in the IQ phase plane.

Further, as the induction device used in the quadrature hybrid coupler of the above-described respective embodiments, various devices may be used. For example, if an on-chip spiral inductor is used, the inductor device may be built in an IC. Further, the shunt capacitor or the like may be manufactured by an IC manufacturing method, which is suitable of mass production.

The present application is based on Japanese Patent Application No. 2012-000793 filed on Jan. 5, 2012, the contents of which are incorporated herein by reference.

INDUSTRIAL APPLICABILITY

The present disclosure is useful for a quadrature hybrid coupler, an amplifier and a wireless communication device that reduce the length of each connection wiring to an induction device or a ground from a shunt capacitor inserted between the induction device and the ground, and reduces an amplitude error or a phase error of an output signal with respect to an input signal.

REFERENCE SIGNS LIST

100: Quadrature hybrid coupler
101a, 101b: Coil
101: Transformer
102, 103, 203, 204: Coupling capacitor
104 to 107, 205 to 208: Shunt capacitor
108, 209: Termination resistance
109, 210, 211: Ground
110, 111, 112, 212, 213, 214: Transmission line (microstrip transmission line)
121 to 124, 131 to 134, 141 to 144: Zigzag wiring (metal wiring)
125a to 125d, 135a to 135e, 145, 146, 126a, 126b, 127a, 127b, 136a, 136b, 137a, 137b, 147, 148: Via
201, 202: Inductor

The invention claimed is:

1. A quadrature hybrid coupler comprising:
an induction device that includes a first terminal, a second terminal, a third terminal and a fourth terminal;
a first microstrip transmission line, a second microstrip transmission line and a third microstrip transmission line that are connected to the first, second and third terminals;
a first coupling capacitor and a second coupling capacitor that are respectively arranged between the first terminal and the second terminal and between the third terminal and the fourth terminal;
a first shunt capacitor, a second shunt capacitor, a third shunt capacitor and a fourth shunt capacitor that are inserted between the first, second, third and fourth terminals and a ground of the first, second and third microstrip transmission lines; and
a termination resistance that is inserted between the fourth terminal and the ground of the first, second and third microstrip transmission lines, wherein
each of the first, second, third and fourth shunt capacitors includes N wiring layers including, where N is an integer of 2 or greater,
a K-th layer wiring provided in at least a K-th wiring layer, where K is any one of 1 to N−1, and
a (K+1)-th layer wiring provided in a (K+1)-th wiring layer,
the K-th layer wiring including
a first zigzag wiring connected to the induction device, and
a second zigzag wiring that is connected to the ground of the microstrip transmission lines, and has a length different from a length of the first zigzag wiring, and
the (K+1)-th layer wiring including
a third zigzag wiring connected to the induction device, and
a fourth zigzag wiring that is connected to the ground of the microstrip transmission lines, and has a length different from a length of the third zigzag wiring, wherein
each of the first, second third and fourth zigzag wirings has a zigzag pattern in which a wiring along a first direction and a wiring along a second wiring crossing the first direction are coupled to each other and the wiring along the first direction and the wiring along the second direction are alternately repeated.

2. The quadrature hybrid coupler according to claim 1, wherein
the first and second zigzag wirings are alternately arranged at an equal interval, and
the third and fourth zigzag wirings are alternately arranged at an equal interval.

3. The quadrature hybrid coupler according to claim 1, wherein
respective corners of the first zigzag wiring and the fourth zigzag wiring cross each other three-dimensionally in a layering direction of the wiring layers, and
respective corners of the second zigzag wiring and the third zigzag wiring cross each other three-dimensionally in a layering direction of the wiring layers.

4. The quadrature hybrid coupler according to claim 3, wherein
the wiring along the first direction and the wiring along the second direction of the first zigzag wiring cross three-dimensionally the wiring along the second direction and the wiring along the first direction of the fourth zigzag wiring in the layering direction of the wiring layers, and
the wiring along the second direction and the wiring along the first direction of the second zigzag wiring cross three-dimensionally the wiring along the first direction and the wiring along the second direction of the third zigzag wiring in the layering direction of the wiring layers.

5. The quadrature hybrid coupler according to claim 1, wherein
respective corners of the first zigzag wiring and the third zigzag wiring cross each other three-dimensionally in a layering direction of the wiring layers, and
respective corners of the second zigzag wiring and the fourth zigzag wiring cross each other three-dimensionally in the layering direction of the wiring layers.

6. The quadrature hybrid coupler according to claim 5, further comprising:

a first via that connects portions of the first zigzag wiring and the third zigzag wiring, which cross each other three-dimensionally in the layering direction of the wiring layers; and a second via that connects portions of the second zigzag wiring and the fourth zigzag wiring, which cross each other three-dimensionally in the layering direction of the wiring layers.

7. The quadrature hybrid coupler according to claim 1, wherein the first and fourth zigzag wirings overlap each other three-dimensionally in a layering direction of the wiring layers, and the second and third zigzag wirings overlap each other three-dimensionally in the layering direction of the wiring layers.

8. The quadrature hybrid coupler according to claim 1, further comprising:

a first floating wiring that is provided in the K-th layer, and is provided at a position corresponding to a bent portion of the third zigzag wiring in a layering direction of the wiring layers, in a periphery of the first zigzag wiring;

a second floating wiring that is provided in the (K+1)-th layer, and is provided at a position corresponding to a bent portion of the first zigzag wiring in the layering direction of the wiring layers, in a periphery of the third zigzag wiring;

a first via that connects the third zigzag wiring and the first floating wiring; and a second via that connects the first zigzag wiring and the second floating wiring.

9. The quadrature hybrid coupler according to claim 1, wherein a crossing angle of the first direction and the second direction is 90 degrees.

10. The quadrature hybrid coupler according to claim 1, wherein the induction device has a symmetrical shape.

11. The quadrature hybrid coupler according to claim 1, wherein the induction device has a configuration in which a plurality of wiring layers is formed in parallel in a spiral shape.

12. The quadrature hybrid coupler according to claim 1, wherein the first and second coupling capacitors are configured using a plurality of comb-shaped wirings of a same length.

13. The quadrature hybrid coupler according to claim 1, wherein the first and second coupling capacitors are configured using a plurality of zigzag wirings of a same length.

14. The quadrature hybrid coupler according to claim 1, wherein a signal is input to the first microstrip transmission line, and signals having a same amplitude and a phase difference of 90 degrees therebetween are output from the second and third microstrip transmission lines.

15. An amplifier comprising:

the quadrature hybrid coupler according to claim 14;

a main amplifier, configured to amplify one output signal from the quadrature hybrid coupler;

a peak amplifier, configured to amplify the other output signal from the quadrature hybrid coupler; and a ¼ wavelength transmission line, configured to delay a phase of an output signal from the main amplifier by 90 degrees.

16. A wireless communication device comprising:

a local signal generator, configured to generate a local signal;

first and second quadrature hybrid couplers according to claim 14, configured to output two signals having a same amplitude and a phase difference of 90 degrees therebetween based on the generated local signal;

a quadrature modulator, configured to quadrature-modulate a transmission signal based on two output signals from the first quadrature hybrid coupler; and a quadrature-demodulator, configured to quadrature-demodulate a reception signal based on two output signals from the second quadrature hybrid coupler.

17. The quadrature hybrid coupler according to claim 1, wherein signals having a same amplitude and a phase difference of 90 degrees therebetween are input to the second and third microstrip transmission lines, and a signal is output from the first microstrip transmission line.

18. A wireless communication device comprising:

a local signal generator, configured to generate a local signal;

a quadrature modulator, configured to quadrature-modulate two input signals having a phase difference of 90 degrees therebetween based on the generated local signal;

the quadrature hybrid coupler according to claim 17, configured to advance or delay, by 90 degrees, a phase of one input signal among the quadrature-modulated two input signals having the phase difference of 90 degrees; and a transmission RF amplifier, configured to amplify an output signal from the quadrature hybrid coupler.

* * * * *